(12) United States Patent
Brennan et al.

(10) Patent No.: US 6,396,107 B1
(45) Date of Patent: May 28, 2002

(54) TRENCH-DEFINED SILICON GERMANIUM ESD DIODE NETWORK

(75) Inventors: Ciaran J. Brennan; Douglas B. Hershberger; Mankoo Lee, all of Essex Junction; Nicholas T. Schmidt, Colchester; Steven H. Voldman, South Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/716,749

(22) Filed: Nov. 20, 2000

(51) Int. Cl.$^7$ ................. H01L 23/62; H01L 31/072; H01L 31/109; H01L 31/0328; H01L 31/0336
(52) U.S. Cl. ................. 257/362; 257/197
(58) Field of Search ................. 257/362, 197

(56) References Cited

U.S. PATENT DOCUMENTS

| | | |
|---|---|---|
| 4,924,340 A | 5/1990 | Sweet |
| 4,928,199 A | 5/1990 | Diaz et al. |
| 5,266,813 A | 11/1993 | Comfort et al. |
| 5,278,444 A | 1/1994 | Lieneweg et al. |
| 5,422,501 A | 6/1995 | Bayraktaroglu |
| 5,475,256 A | 12/1995 | Sawada et al. |
| 5,523,606 A | 6/1996 | Yamazaki |
| 5,567,961 A | 10/1996 | Usagawa et al. |
| 5,594,266 A | 1/1997 | Beigel et al. |
| 5,629,544 A | 5/1997 | Voldman et al. |
| 5,648,666 A | 7/1997 | Tran et al. |
| 5,774,318 A | 6/1998 | McClure et al. |
| 5,837,589 A | 11/1998 | McNamara et al. |
| 5,841,169 A | 11/1998 | Beasom |
| 5,846,867 A | 12/1998 | Gomi et al. |
| 5,872,378 A | 2/1999 | Rose et al. |
| 5,891,792 A | 4/1999 | Shih et al. |
| 5,895,958 A | 4/1999 | Miki |
| 5,939,767 A | 8/1999 | Brown et al. |
| 6,137,664 A | * 10/2000 | Casper et al. ................. 361/56 |

* cited by examiner

Primary Examiner—Ngân V. Ngô
(74) Attorney, Agent, or Firm—DaLio & Peterson, LLC; Peter W. Peterson; Mark F. Chadurjian

(57) ABSTRACT

A silicon-germanium ESD element comprises a substrate of a first dopant type coupled to a first voltage terminal and a first diode-configured element. The first diode-configured element has a collector region of a second dopant type in the substrate, a SiGe base layer of the first dopant type on the collector region, with the SiGe base layer including a base contact region, and an emitter of the second dopant type on the SiGe base layer. Preferably, the SiGe base layer ion the collector region is an epitaxial SiGe layer and the second dopant type of the emitter is diffused in to the SiGe base layer. The ESD element of the present invention may further include a second diode-configured element of the same structure as the first diode-configured element, with an isolation region in the substrate separating the first and second diode-configured elements. The first and second diode-configured elements form a diode network. In each of the embodiments, the isolation regions may be disposed adjacent the collector regions of the diode elements and below a portion of the SiGe base layer of the diode elements. The SiGe base layer in the diode elements preferably comprises an active, single crystal layer in a portion directly over the collector region and a polycrystalline layer in portions directly over the isolation regions. The isolation regions may be shallow or deep trench isolations.

31 Claims, 21 Drawing Sheets

Common Emitter with Base Resistor

NPN Common Emitter with Grounded Base
(through resistor with Diode Cascade)

Cascaded Common Emitter

TRENCH-DEFINED SILICON GERMANIUM ESD DIODE NETWORK

BACKGROUND OF THE INVENTION

1. Field of the Invention

The present invention relates to microelectronic devices and, in particular, to a silicon germanium-based circuit and network configuration to reduce harmful effects of electrostatic discharge in such devices.

2. Description of Related Art

Electrostatic discharge (ESD) phenomenon causes high voltage and/or current to be impressed across the terminals of microelectronic and other devices. Both voltage and the current spikes, usually of very short duration, can break down the isolation or diffusions in various portions of individual such devices, thus rendering the device completely or partially inoperable.

The energy spectrum as a function of frequency of an ESD event is a function of the ESD phenomenon. There are three models in use to describe ESD: the human body model (HBM), the machine model (MM), and the charge device model (CDM). In the human body model, a 4 KV pulse is assumed with a maximum current of 2.6 amperes with a 150 ns event time. In the 400 volt machine model, a maximum of 7 amperes is assumed with a 10–50 ns event time. In the charge device model, voltages as high as 1 KV and currents of 9 to 10 amperes with 0.25 ns event times are assumed. For the CDM mechanism, the energy spectrum is contained within the 0 to 5 GHz frequencies regime with negligible energy beyond 5 GHz. In general, ESD events occur at frequencies lower than 5 GHz. There is a need for ESD protection systems which function without impacting the functional performance of the active and passive elements' chip performance. In an integrated semiconductor chip, core and peripheral circuitry have high frequency device components. For example, the high speed transistor of a SiGe technology can be between 50 GHz to 100 GHz. For a SiGeC technology transistor, levels of 100 to 150 GHz are obtainable. Hence there is a desire to have an ESD element which is faster than the ESD HBM, MM, and CDM phenomenon (f>5 GHz) and whose cutoff frequency is less than the high speed functional transistor.

Capacitive loading becomes a major concern for microelectronic chips running at RF frequencies, i.e., frequencies greater than 1 GHz, as the capacitive loading of conventional ESD devices has an adverse effect on device performance. The total capacitance looking into a device is the sum of the ESD device and the circuit capacitances:

$$C_{TOT} = C_{CKT} + C_{ESD}$$

RF circuits are designed with low capacitance, but ESD circuits and devices have relatively high capacitances. $C_{TOT}$ can become driven by $C_{ESD}$ and the chip fails to perform. For example, at 1 GHz a capacitance of 1 pF is acceptable, but at 10 GHz the capacitance must be in the order of 0.1 pF, which is difficult to achieve, and for 100 GHz the capacitance would need to be around 0.01 pF, which is very difficult if impossible to achieve with conventional ESD protection circuits.

Integrated circuit performance improvements continue to drive technological advances such as the implementation of silicon germanium (SiGe) based semiconductor circuitry due to its high frequency attributes and small chip size designs. With such reductions in chip size the ESD protection pad structure must be enlarged to compensate for the limited ability to get enough current discharge from small chips due to the limited umber of I/Os. However, such enlarged ESD pad structures cause detrimental capacitive loading effects which distort frequency and impact chip performance. Data comparing performance of SiGe devices over wide frequency ranges indicates significant performance degradation for those with ESD protection versus those without. There is need for an ESD protection system which functions without impacting non-ESD device performance, to discharge power to ground intended for high frequency applications.

Bearing in mind the problems and deficiencies of the prior art, it is therefore an object of the present invention to provide a system for an improved ESD protection system for microelectronic devices.

It is another object of the present invention to provide ESD protection for SiGe devices which does not degrade the performance of such devices.

A further object of the invention is to provide a circuit and network which prevents harmful voltage and current spikes for microelectronic devices.

It is yet another object of the present invention to provide ESD protection for digital, analog and radio frequency (RF) applications.

It is another object of the present invention to provide ESD protection for mixed voltage and mixed signal applications.

Another object of the present invention is to provide an ESD element which is faster than the ESD HBM, MM, and CDM phenomenon (f>5 GHz) and whose cutoff frequency is less than the high speed functional transistor.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a silicon-germanium ESD element comprising a substrate of a first dopant type coupled to a first voltage terminal and a first diode-configured element. The first diode-configured element has a collector region of a second dopant type in the substrate, a SiGe base layer of the first dopant type on the collector region, with the SiGe base layer including a base contact region, and an emitter of the second dopant type on the SiGe base layer. Preferably, the SiGe base layer ion collector region is an epitaxial SiGe layer and the second dopant type of the emitter is diffused in to the SiGe base layer.

The ESD element of the present invention may further include a second diode-configured element of the same structure as the first diode-configured element, with an isolation region in the substrate separating the first and second diode-configured elements. The first and second diode-configured elements form a diode network. The isolation region may be a shallow trench isolation or a deep trench isolation.

In a first preferred embodiment, the present invention provides a diode network comprising a substrate of a first dopant type coupled to a first voltage terminal and a first diode element and a second diode element. Each diode element has a collector region of a second dopant type in the substrate, a SiGe base layer of the first dopant type on the collector region, with the SiGe base layer including a base contact region, an emitter of the second dopant type on the SiGe base layer, and a circuit electrically coupling the emitter to the base contact region. An input pad is coupled to the coupled emitters/contact regions of the first and second diode elements, and the collector region of the first diode element is coupled to a second voltage terminal. The SiGe base layer of the first diode element comprises an anode of the first diode element and the collector region of the first diode element comprises a cathode of the first diode element. The collector region of the second diode element is coupled to the input pad, so that the substrate comprises an anode of the second diode element and the collector region of the second diode element comprises a cathode of the second diode element.

In a second preferred embodiment, the invention provides a diode network comprising a substrate of a first dopant type coupled to a first voltage terminal and a first diode element and a second diode element. Each diode element has a collector region of a second dopant type in the substrate, a SiGe base layer of the first dopant type on the collector region, with the SiGe base layer including a base contact region, and an emitter of the second dopant type on the SiGe base layer. A circuit electrically couples the emitter to the base contact region in the first diode element and a circuit electrically couples the emitter in the second diode element to the substrate and first voltage terminal. An input pad is coupled to the coupled emitters/contact region of the first diode element and the collector region of the second diode element. The collector region of the first diode element is coupled to a second voltage terminal, so that the SiGe base layer of the first diode element comprises an anode of the first diode element and the collector region of the first diode element comprises a cathode of the first diode element. The collector region of the second diode element is coupled to the input pad, so that the SiGe base layer comprises an anode of the second diode element and the collector region of the second diode element comprises a cathode of the second diode element.

In another embodiment of the present invention, there is provided a diode network comprising a substrate of a first dopant type coupled to a first voltage terminal and a first diode element and a second diode element. Each diode element has a collector region of a second dopant type in the substrate, a SiGe base layer of the first dopant type on the collector region, with the SiGe base layer including a base contact region, and an emitter of the second dopant type on the SiGe base layer. A circuit electrically couples the emitter to the base contact region and an input pad is coupled to the coupled emitters/contact region of the second diode element. The collector region of the first diode element is coupled to a second voltage terminal, so that the SiGe base layer of the first diode element comprises an anode of the first diode element and the collector region of the first diode element comprises a cathode of the first diode element. The collector region of the second diode element is coupled to the coupled emitters/contact region of the first diode element, so that the SiGe base layer of the second diode element comprises an anode of the second diode element and the collector region of the second diode element comprises a cathode of the second diode element.

A further embodiment of the present invention provides a diode comprising a substrate of a first dopant type coupled to a first voltage terminal and a diode element. The diode element has a collector region of a second dopant type in the substrate, a SiGe base layer of the first dopant type on the collector region, with the SiGe base layer including a base contact region, and an emitter of the second dopant type on the SiGe base layer. The collector region of the diode element is coupled to an input pad and the emitter of the diode element is coupled to a second voltage terminal, so that the substrate comprises an anode of the diode element and the collector region comprises a cathode of the diode element.

Yet another embodiment of the present invention provides a diode comprising a substrate of a first dopant type coupled to a first voltage terminal and a diode element having a collector region of a second dopant type in the substrate, a SiGe base layer of the first dopant type on the collector region, with the SiGe base layer including a base contact region, and an emitter of the second dopant type on the SiGe base layer. An input pad is coupled to the SiGe base layer, the collector region of the diode element is coupled to both the input pad and the base layer, and the emitter of the diode element coupled to a second voltage terminal, so that the substrate comprises an anode of the diode element and the collector region comprises a cathode of the diode element.

The present invention provides a further embodiment of a diode network comprising a substrate of a first dopant type coupled to a first voltage terminal and a plurality of diode elements. Each diode element has a collector region of a second dopant type in the substrate, with each collector region being coupled to the first voltage terminal, a SiGe base layer of the first dopant type on the collector region, with the SiGe base layer including a base contact region and an emitter of the second dopant type on the SiGe base layer. An input pad is coupled to the emitter of a first one of the diode elements and there is provided a plurality of clamping elements coupled in series. The base layer of each diode element is coupled to the emitter of an adjacent diode element, except for the base layer of a last one of the diode elements which is coupled to a second rail voltage source, and each of the clamping elements is connected across the coupled base-emitters of adjacent diode elements. The clamping elements may be one or more of elements such as reach through resistors, silicon germanium polysilicon resistors, silicon germanium npns, or silicon germanium pnps.

Another embodiment of the present invention provides a diode network comprising a substrate of a first dopant type coupled to a first voltage terminal and a plurality of diode elements. Each diode element has a collector region of a second dopant type in the substrate, with each collector region being coupled to the first voltage terminal, a SiGe base layer of the first dopant type on the collector region, with the SiGe base layer including a base contact region and an emitter of the second dopant type on the SiGe base layer. An input pad is coupled to the emitter of a first one of the plurality of diode elements and the base layer of each of the plurality of diode elements is coupled to the emitter of an adjacent one of the plurality of diode elements, except for the base layer of a last one of the plurality of diode elements which is coupled to the second voltage terminal. The diode network also includes a further diode element having the base layer coupled to the base layer of the last of the plurality of diode elements, a collector region coupled to the first voltage terminal, and the emitter coupled to the second voltage terminal.

In a further embodiment, the present invention provides a diode network comprising a substrate of a first dopant type coupled to a first voltage terminal and a plurality of diode elements. Each diode element has a collector region of a second dopant type in the substrate, a SiGe base layer of the first dopant type on the collector region, with the SiGe base layer including a base contact region and an emitter of the second dopant type on the SiGe base layer. An input pad is coupled to the base layer of a first one of the diode elements and the emitter of each of the diode elements is coupled to the base layer of an adjacent diode element, except for the emitter of a last one of the diode elements which is coupled to a second rail voltage source. Each collector region is coupled to a common collector voltage terminal, or to different terminals.

In each of the embodiments, the isolation regions may be disposed adjacent the collector regions of the diode elements and below a portion of the SiGe base layer of the diode elements. The SiGe base layer in the diode elements preferably comprises an active, single crystal layer in a portion directly over the collector region and a polycrystalline layer in portions directly over the isolation regions.

Yet another embodiment of the present invention provides a frequency cutoff ESD protection network for high frequency applications. The network comprises a first device on a chip having circuitry with a first frequency response and a second device on the chip having circuitry with a second frequency response, the second frequency response being less than the first frequency response. Preferably, at least one of the devices is a SiGe device, and both the first and second devices may be SiGe devices. More preferably, one or both of the first and second devices comprises a substrate of a first dopant type coupled to a first voltage terminal and a diode-configured element. The diode-configured element has a collector region of a second dopant type in the substrate; a SiGe base layer of the first dopant type on the collector region, the SiGe base layer including a base contact region; and an emitter of the second dopant type on the SiGe base layer. The second device preferably has circuitry having a second frequency greater than 5 GHz.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 2b is a circuit diagram of the wiring configuration of FIG. 2a.

FIG. 3b is a circuit diagram of the wiring configuration of FIG. 3a.

FIG. 4b is a circuit diagram of the wiring configuration of FIG. 4a.

FIG. 5b is a circuit diagram of the wiring configuration of FIG. 5a.

FIG. 6b is a circuit diagram of the wiring configuration of FIG. 6a.

FIG. 24 is a graphical representation of the

DESCRIPTION OF THE PREFERRED EMBODIMENT(S)

Figure 1:
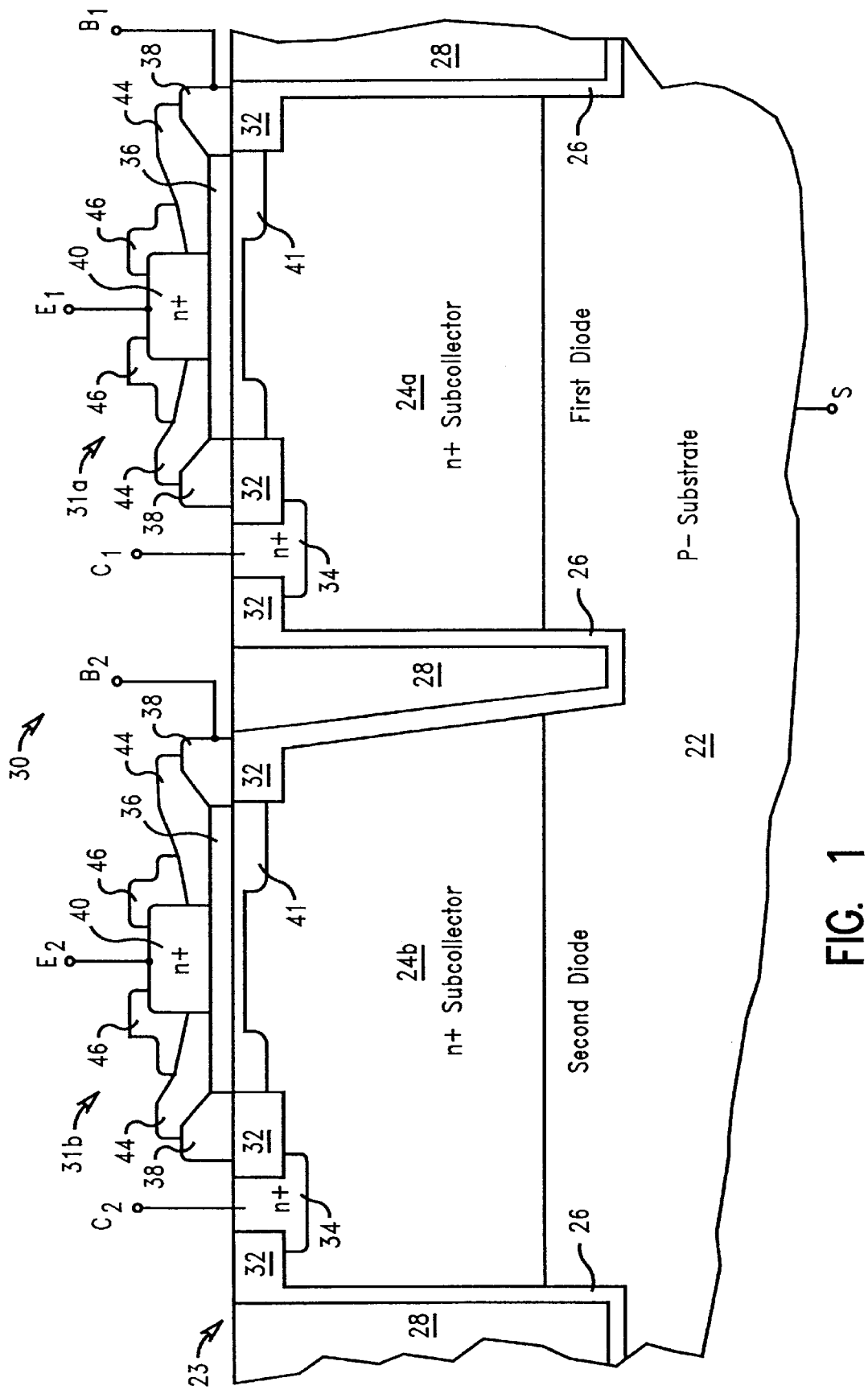
FIG. 1 is an elevation view of a cross-section of one embodiment of the SiGe diode network of the present invention.

In describing the preferred embodiment of the present invention, reference will be made herein to FIGS. 1–28 of the drawings in which like numerals refer to like features of the invention. Features of the invention are not necessarily shown to scale in the drawings.

The present invention provides an ESD network which is formed using silicon germanium (SiGe) transistor elements for radio frequency (RF) and mixed signal applications as well as for mixed voltage interface network for digital/ analog applications. SiGe heterojunction bipolar transistor (HBT) devices in diode configuration provide ESD protection. Also, SiGe HBT device base-collector or base-emitter junctions provide ESD protection for positive pulses, and SiGe HBT device collector-substrate junctions provide ESD protection for negative pulses. SiGe HBT devices in serial configuration provide ESD protection for mixed signal applications.

FIG. 1 shows an embodiment of the present invention and depicts a diode network 30 which comprises a first diode element 31a and a second diode element 31b. Both diode elements are formed in a substrate 22 of polysilicon or other suitable material of a first dopant type, in this case p–. For identification purposes, the substrate is also identified schematically as S. Subcollector regions 24a, 24b of the first and second diode elements, respectively, are formed in the lower portions of the substrate of a second dopant type, e.g., n+. Subcollector regions 24a and 24b of diode network 30 are bounded from adjacent devices by deep trenches comprising trench isolation material 26 which contains a polysilicon trench filled material 28. Above each deep trench there is a shallow trench isolation region (STI) 32. The collector regions of each diode are low-doped regions at the surface 23 of substrate 22 between STI regions 32. As used herein, and unless otherwise distinguished, the term collector refers to both the collector region at the substrate surface and the deeper, more heavily doped subsurface subcollector regions, 24a, 24b. Also provided are reach through regions 34 of the second dopant type (n+) which enable a connection at the substrate surface 23. The collector regions of the first and second diode reach through connections are identified schematically as $C_1$ and $C_2$, respectively. Each reach through region 34 is bounded by shallow trench isolation regions (STI) 32. Doped extrinsic and intrinsic base region 41 is also disposed between STI regions 32.

Directly above p− dopant region 41 and over a portion of the STI regions 32 there is disposed a silicon germanium base layer of the first dopant type, e.g. p+, having an active, single crystal portion 36 directly over each of the collector and n+ subcollector regions 24a and 24b, and polycrystalline base contact regions 38 of the same, first dopant type, e.g., p+, over the isolation regions 32. Above each of the single crystal silicon germanium base regions 36 is an emitter 40 of the second dopant type, e.g. n+, preferably arsenic doped polysilicon. The contacts for the silicon germanium base layer and base contact regions are identified schematically as $B_1$ and $B_2$ respectively for each of the first and second diode elements. The contacts for the first and second diode emitters 40 are identified schematically as $E_1$ and $E_2$, respectively. Preferably, the silicon germanium base layer 36 is an epitaxial silicon germanium layer and the emitter 40 is diffused at least partially into the silicon germanium base layer. The silicon germanium base regions can contain carbon forming a SiGeC compound. Isolation 44 may be provided over the silicon germanium based layer 36 and base contact regions 38 adjacent emitter 40, and nitride caps 46 may be provided above the silicide caps adjacent each of the emitters 40.

Additional SiGe diode elements with similar configuration can be constructed adjacent the SiGe diode elements shown in FIG. 1, each separated from the other by an isolation region. The diode components in the preferred embodiment in FIG. 1 may be connected in various circuit arrangements, ranging from one SiGe diode element to three, four or more SiGe diode elements, depending upon the type of ESD protection desired.

Figure 2A:
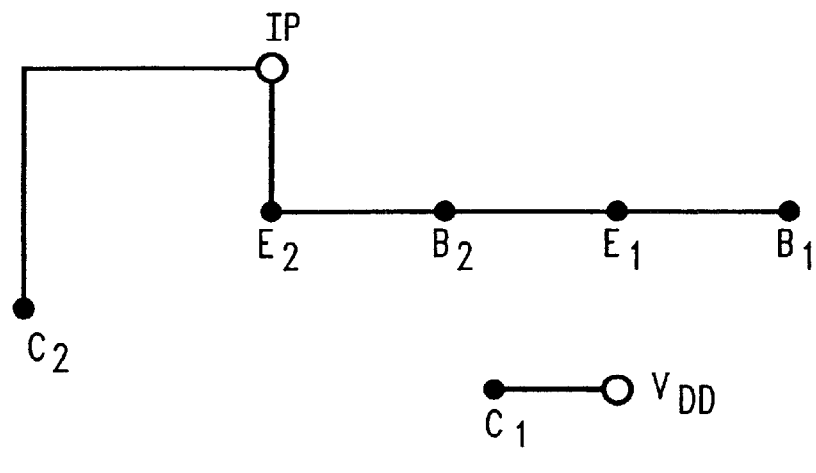
FIG. 2a is a schematic of a first preferred wiring configuration for the SiGe diode network of FIG. 1.
Figure 2B:
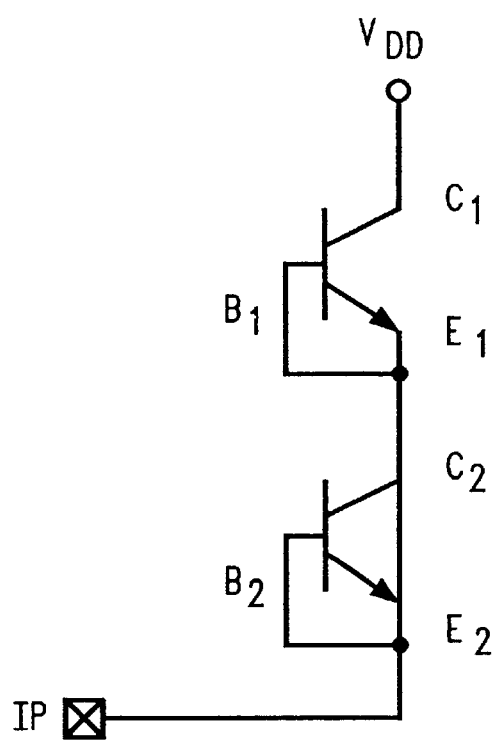

FIG. 2a is a schematic of a first preferred wiring configuration showing the physical circuit connections for each of the silicon germanium base layers $B_1$, $B_2$, emitters $E_1$, $E_2$, collectors $C_1$, $C_2$, and substrate S. FIG. 2b shows the same connections if FIG. 2a in conventional circuit diagram. Thus, as shown in FIGS. 2a and 2b, the substrate S is electrically connected or coupled to a first voltage terminal $V_{ss}$ and input pad, IP is coupled to each of the silicon germanium base layers $B_1$, $B_2$ and emitters $E_1$, $E_2$. The collector region of the first diode element $C_1$ is coupled to a second voltage terminal $V_{dd}$ such that the silicon germanium base layer of the first diode element comprises an anode of the first diode element and the collector region of the first diode element comprises a cathode of the first diode element. The collector region of the second diode element $C_2$ is coupled to the input pad IP so that the substrate S comprises an anode of the second diode element and the collector region of the second diode element $C_2$ comprises a cathode of the second diode element.

The circuit connection shown in FIGS. 2a and 2b is particularly useful because it provides ESD protection for positive and negative polarity pulses.

Figure 3A:
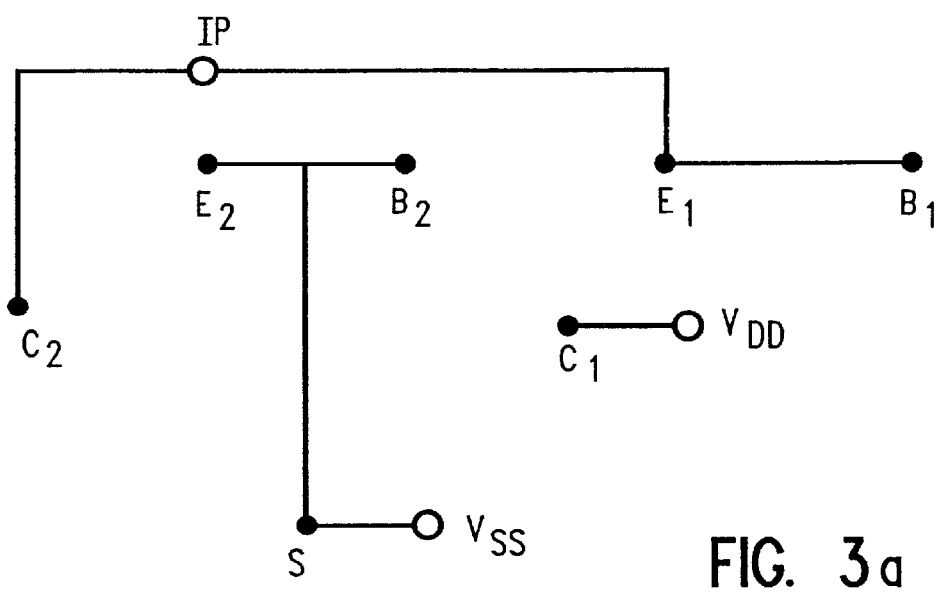
FIG. 3a is a schematic of a second preferred wiring configuration for the SiGe diode network of FIG. 1.
Figure 3B:
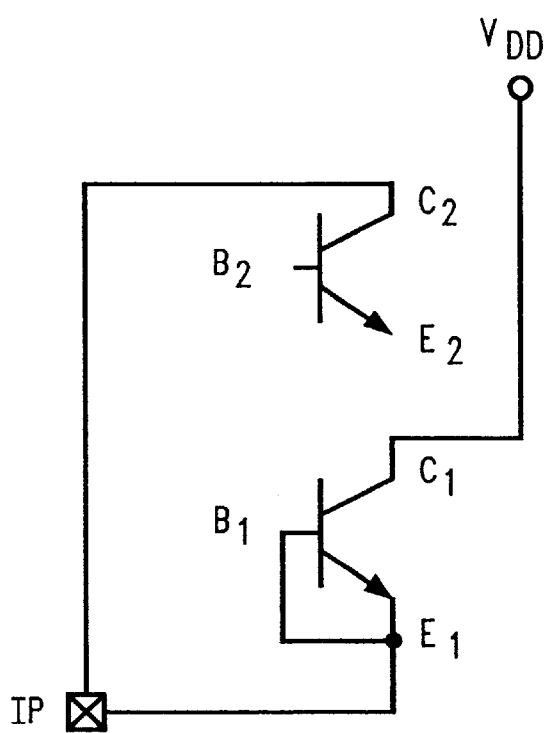

FIGS. 3a and 3b depict a second preferred wiring configuration in a manner analogous to the schematic and wiring diagrams shown in FIGS. 2a and 2b, respectively. The emitter and base contact regions of the first diode element $E_1$, $B_1$, are electrically coupled to the input pad IP and the substrate S is coupled to a first voltage terminal $V_{ss}$. As compared to the previous embodiment, in the embodiment shown in FIGS. 3a and 3b, the emitter and base contact regions of the second diode element $E_2$, $B_2$, are electrically decoupled from each other and from and from the input pad IP. The collector region of the first diode element $C_1$ is coupled to a second voltage terminal $V_{dd}$. The emitter of the second diode element $E_2$ is electrically coupled to the first voltage terminal $V_{ss}$ such that the silicon germanium base layer of the second diode element $B_2$ is an anode of the second diode element. This type of circuit is particularly useful because it provides ESD protection of RF circuits with a single power supply voltage which has its $V_{dd}$ power supply consistent with the native voltage, i.e., the IP voltage would stay below $V_{dd}$.

Figure 4A:
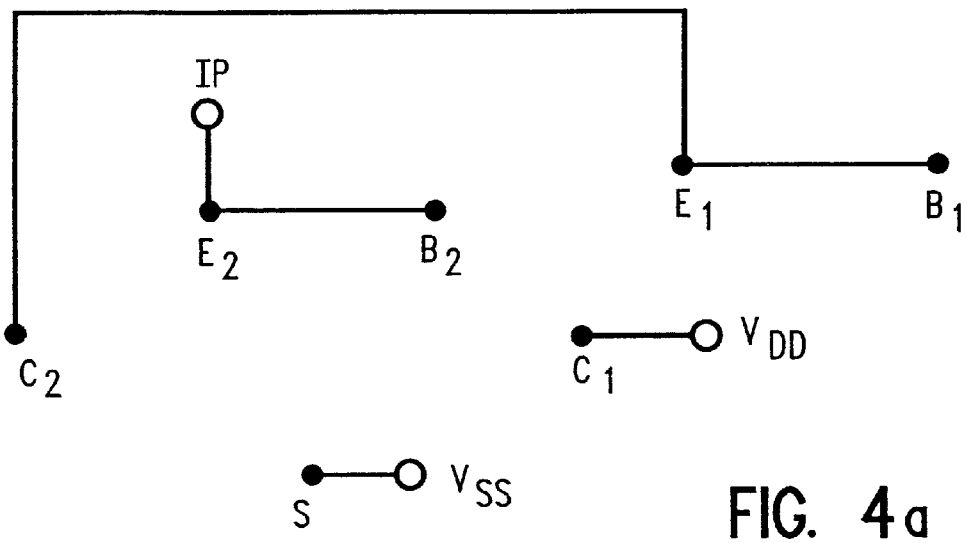
FIG. 4a is a schematic of a third preferred wiring configuration for the SiGe diode network of FIG. 1.
Figure 4B:
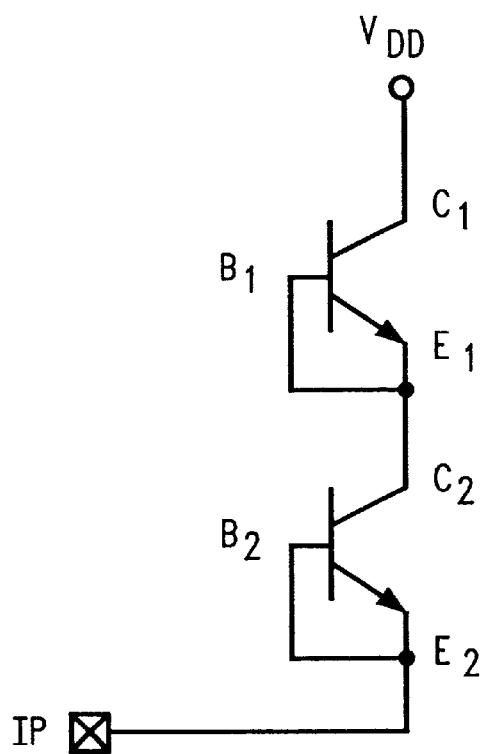

FIGS. 4a and 4b depict another wiring configuration, again in schematic and circuit diagram form, respectively. Compared to FIGS. 2a and 2b, in the configuration of FIGS. 4a and 4b collector region $C_2$ of the second diode element and the emitter/contact emitter/contact region of the first diode element $E_1$, $B_1$ are both decoupled from the input pad and are instead coupled to each other. The emitter and base contact regions of the second diode element $E_2$, $B_2$, are electrically coupled to input pad IP. The collector region of the first diode element $C_1$ is coupled to a second voltage terminal $V_{dd}$. In each diode element, the SiGe base layers, $B_1$ and $B_2$ comprise an anode of the diode element and the collector regions $C_1$ and $C_2$ comprise a cathode of the diode element. This circuit is particularly useful because it provides a mixed voltage silicon germanium npn ESD network with shared isolation for positive polarity pulse.

Figure 5A:
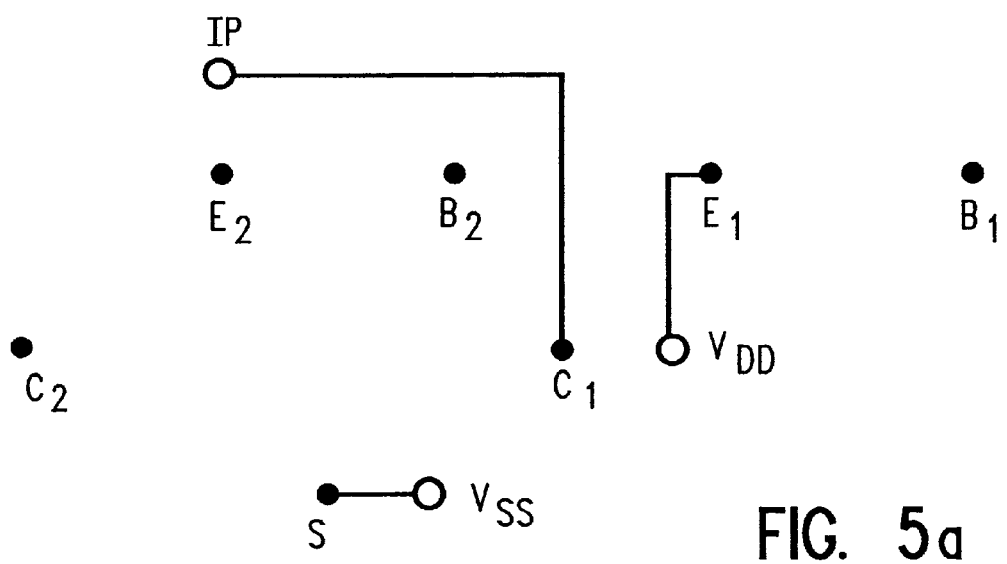
FIG. 5a is a schematic of a fourth preferred wiring configuration for the SiGe diode network of FIG. 1.
Figure 5B:
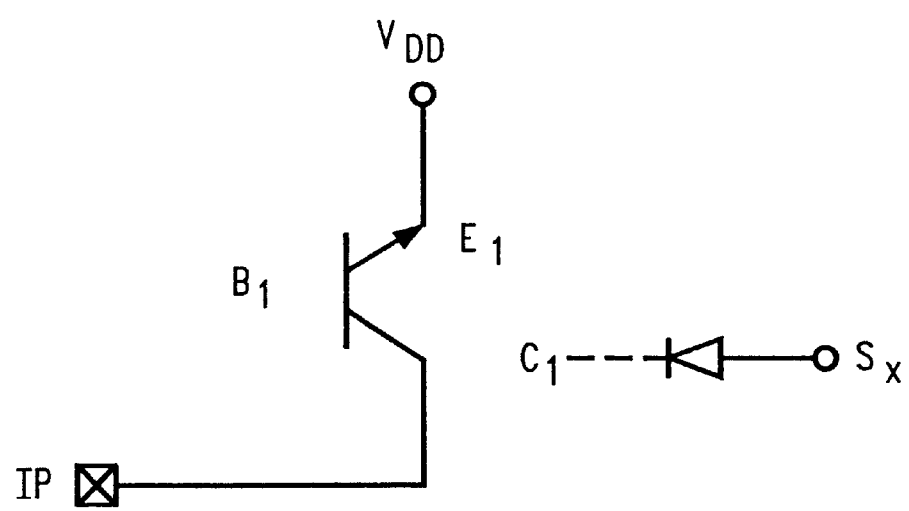

FIGS. 5a and 5b depict in schematic and circuit diagram form, respectively, a further wiring configuration involving only the first diode element. Substrate S is connected to first voltage terminal $V_{ss}$ and emitter $E_1$ is connected to second voltage terminal $V_{dd}$. The collector $C_1$ is connected to the input pad and a [parasitic diode substrate forming a collector $S_x$ diode. Base $B_1$ is floating to provide an npn to $V_{dd}$. In the diode element shown, the substrate comprises an anode of the diode element and the collector region comprises a cathode of the diode element. With $E_1$ connected to $V_{dd}$ it provides an open base SiGe HBT in common emitter mode. This circuit is particularly useful because it provides ESD protection against positive discharges above $V_{DD}$ and against negative discharges below $V_{ss}$.

Figure 6A:
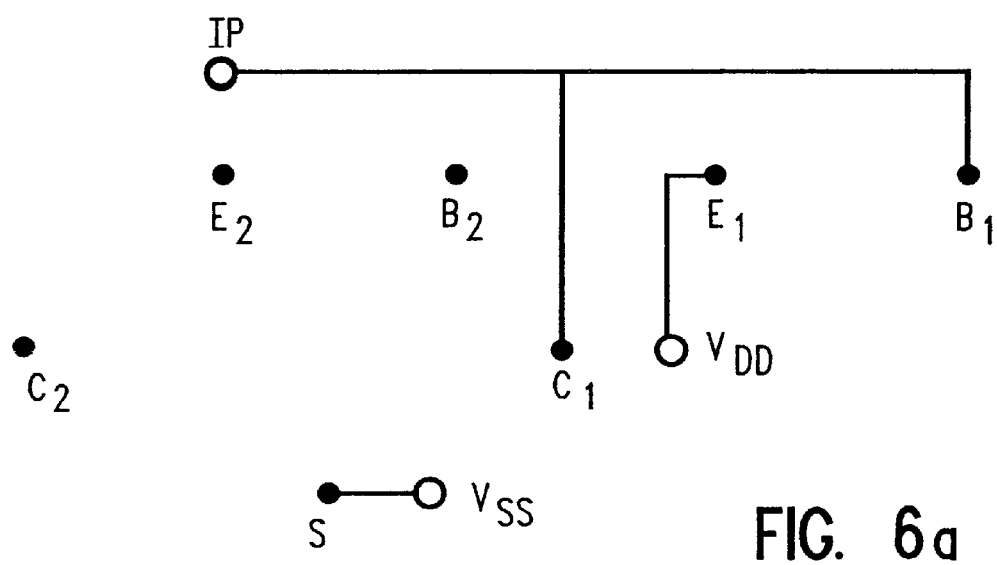
FIG. 6a is a schematic of a fifth preferred wiring configuration for the SiGe diode network of FIG. 1.
Figure 6B:
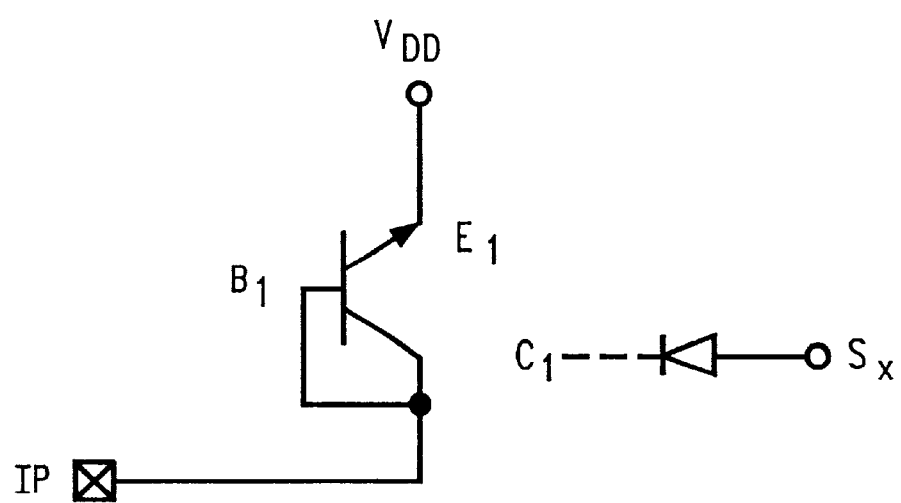

FIGS. 6a and 6b depict, in schematic and circuit diagram form, respectively, another wiring configuration of the present invention again involving only the first diode element. Substrate S is connected to first voltage terminal $V_{ss}$, collector $C_1$ and base layer $B_1$ are both connected to an input pad, and emitter $E_1$ is connected to second voltage terminal $V_{dd}$. As with the diode element of FIGS. 5a and 5b, the substrate comprises the anode and the collector region comprises the cathode. In this configuration, the SiGe collector—$S_x$ diode ESD elements and additional base-emitter junction serves as a diode as well as a base-driven or base-coupled npn device. This circuit is particularly useful because it provides a silicon germanium npn element for negative polarity HVM pulse to $V_{dd}$ or substrate with the base tied to the input.

Figure 7:
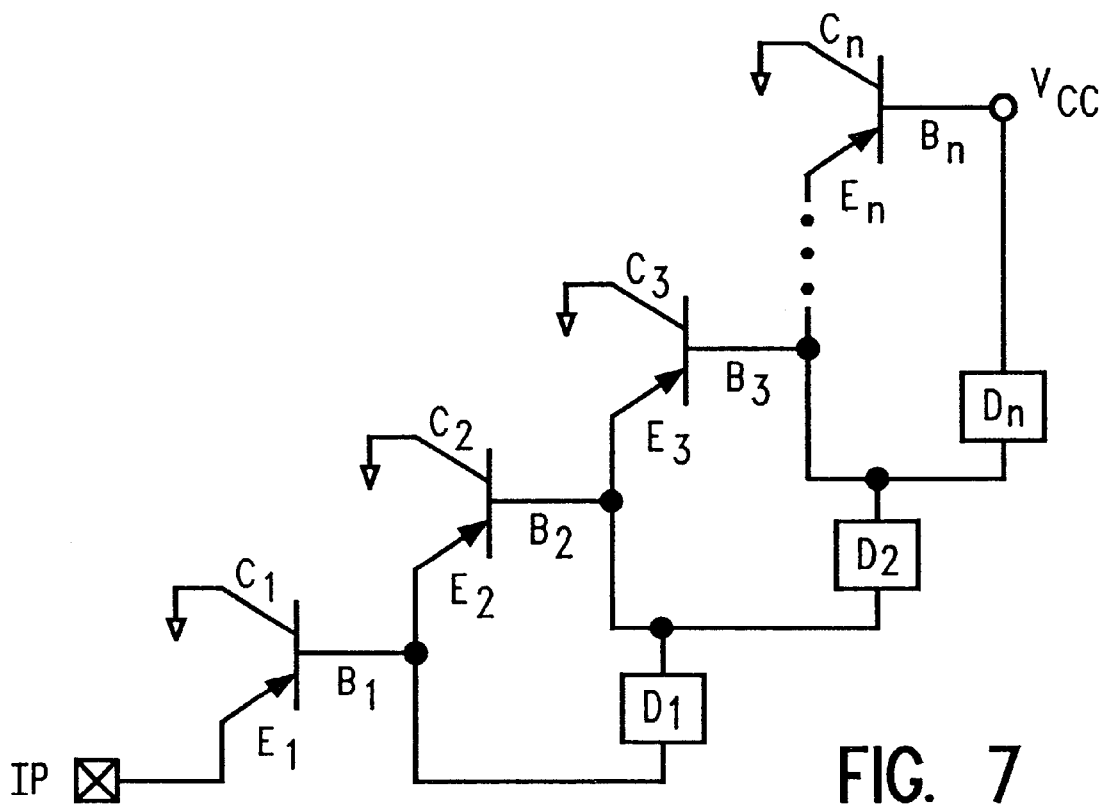
FIG. 7 is a circuit diagram of a sixth preferred wiring configuration for the SiGe diode network of FIG. 1.
Figure 8:
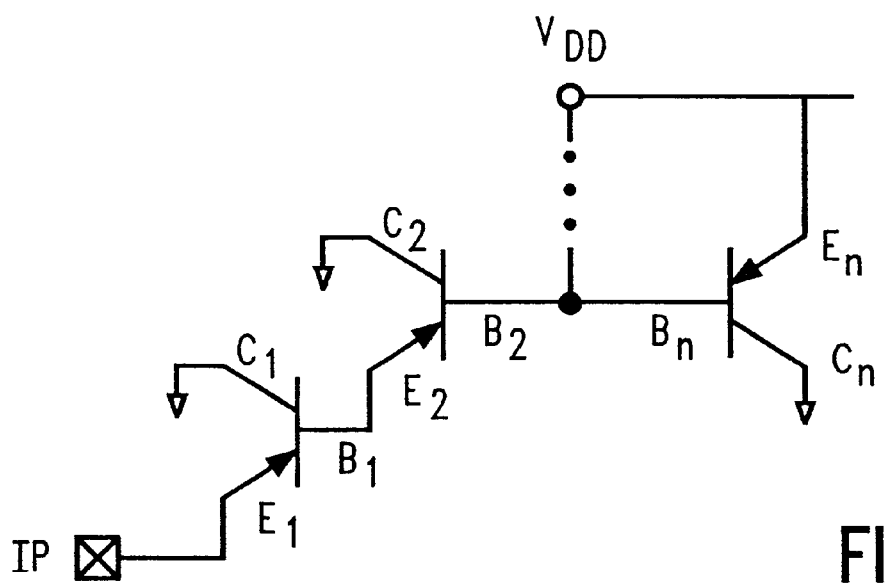
FIG. 8 is a circuit diagram of an eighth preferred wiring configuration for the SiGe diode network of FIG. 1.

FIG. 7 depicts in circuit diagram form a further SiGe circuit configuration. This configuration comprises a series of SiGe pnp HBTs in common collector configuration with shunt elements for mixed voltage applications. The collectors $C_1$, $C_2$, $C_3$, . . . , $C_n$ are all commonly connected to the first rail, ground. The emitter $E_1$ of the first HBT is connected to an input pad IP and the base $B_1$ of the first HBT is connected to the emitter $E_2$ of the second HBT as well as a first Darlington shunting element or clamp $D_1$. The base $B_2$ of the second HBT is then connected to the emitter $E_3$ of the third HBT as well as a second Darlington shunting or clamping element $D_2$, and so on, until one reaches the nth HBT. A clamping element D is therefore connected across the base-emitter junction of each of the HBTs. The base $B_n$ of the nth HBT is connected to the second rail, $V_{cc}$. This circuit provides a mixed voltage silicon germanium based ESD network with Darlington shunting elements $D_1$, $D_2$, . . ., $D_n$. The clamp elements D can be any one of either reach through resistors, silicon germanium polysilicon resistors, silicon germanium npns, silicon germanium pnp in diode configuration and other elements. The clamping devices can be CMOS based elements as well, for example, NFET, PFET, n-well, p resistors, n+ resistors and the like. This circuit is particularly useful because it provides the ability to use in mixed voltage applications.

FIG., 8 depicts in circuit diagram form a further wiring configuration of the present invention. The circuit forms a diode string of SiGe HBT devices of pnp variety. The string is connected to a common collector configuration with shunt elements. Each collector region $C_1$, $C_2$ of the diode string is coupled to the first rail or voltage terminal, ground, and input pad IP is coupled to the emitter $E_1$ of the first HBT of the diode string. The base $B_1$ of the first diode element in the string is coupled to the emitter, e.g., $E_2$, of an adjacent diode element, except for the base $B_2$ of the last of diode elements in the string is coupled to the second voltage terminal, $V_{DD}$. The nth HBT diode element has a base layer $B_n$ coupled to the base $B_2$, a collector $C_n$ coupled to ground, and emitter $E_n$ coupled to $V_{DD}$. This circuit is particularly useful because it provides a silicon germanium pnp mixed voltage ESD network with a Darlington shunt silicon germanium transistor.

Figure 9A:
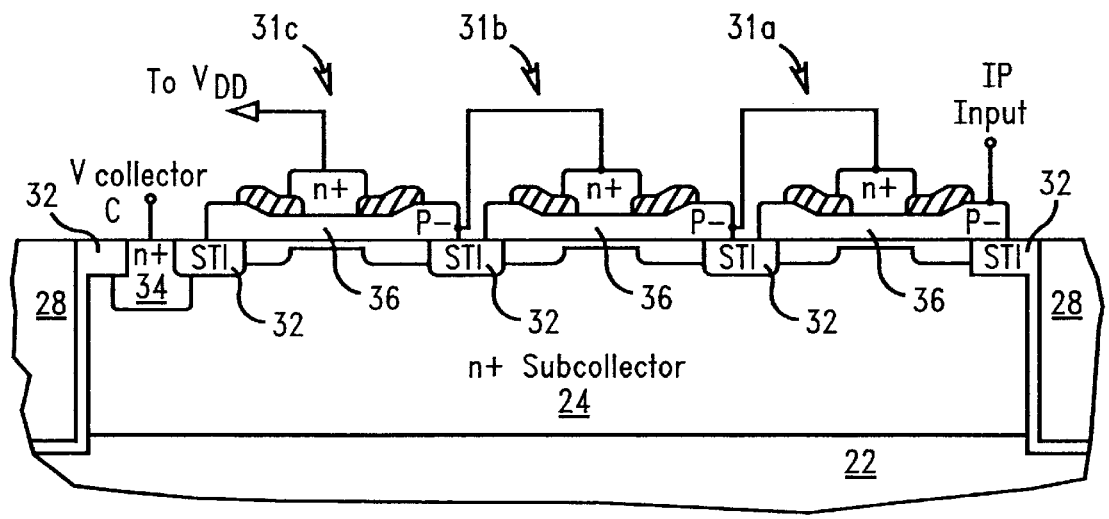
FIG. 9a is an elevation view of a cross-section of another embodiment of the SiGe diode network of the present invention.

FIG. 9 depicts a further embodiment of the present invention in which there are provided first, second and third SiGe diode elements 31a, 31b and 31c, respectively which are collectively separated from the remaining substrate structure by deep trench isolation 26/fill 28 regions. Between each of the individual SiGe diode elements 31a, 31b, 31c there are provided shallow trench isolation (STI) structures 32. The first, second and third SiGe diode elements are all disposed above a common n+ subcollector 24 situated in substrate 22. A common n+ collector reach through region 34 is provided between a shallow trench isolation regions 32.

Figure 9B:
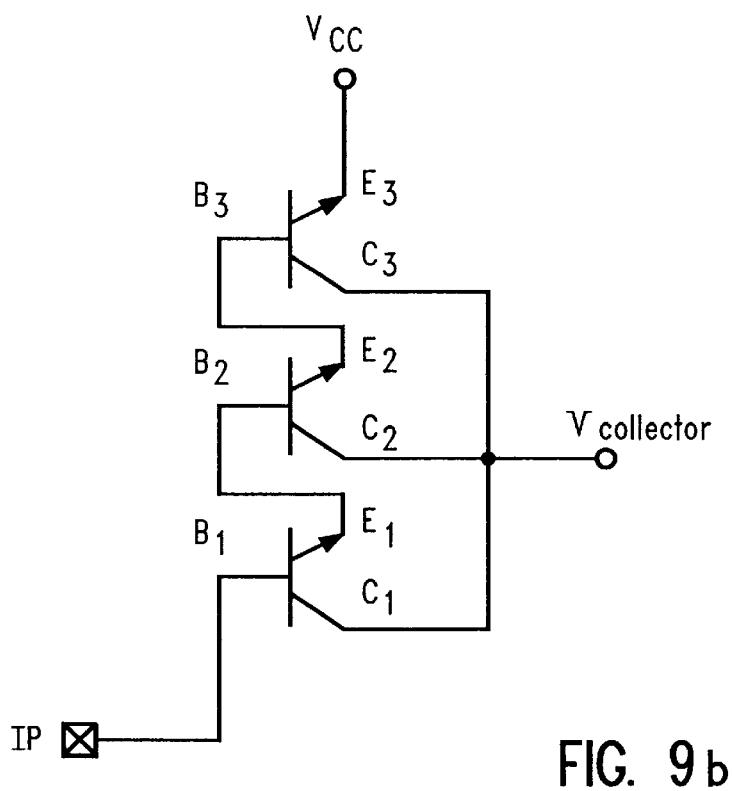
FIG. 9b is a circuit diagram of the wiring configuration for the diode network of FIG. 9.

The circuit diagram for the embodiment of FIG. 9 is depicted in FIG. 9b. There is shown a diode string with repeated base-emitter connections so that the diodes are in series, and the base-emitter junctions are connected to $V_{cc}$. In this embodiment, the input pad IP is coupled to the base layer $B_1$ of the first HBT diode element. The emitters $E_1$, $E_2$ of the first and second diode element are coupled to the base layers $B_2$, $B_3$ of the second and third diode elements, respectively. The emitter $E_3$ of the third diode element is coupled to a second rail voltage source $V_{cc}$. The diode collectors $C_1$, $C_2$, $C_3$ are commonly coupled at $V_{collector}$ and the low capacitance base-emitter junction is being used for the string of SiGe HBT npn devices. Alternatively, the diode collectors are not commonly coupled. This circuit is particularly useful because it provides a common collector silicon germanium npn ESD network contained within the collector volume, where the base-collector capacitance can be modulated, and provides a low capacitance circuit useful for mixed voltage interfaces where the input pad mixed voltage extends above the power supply pad voltage.

Figure 10:
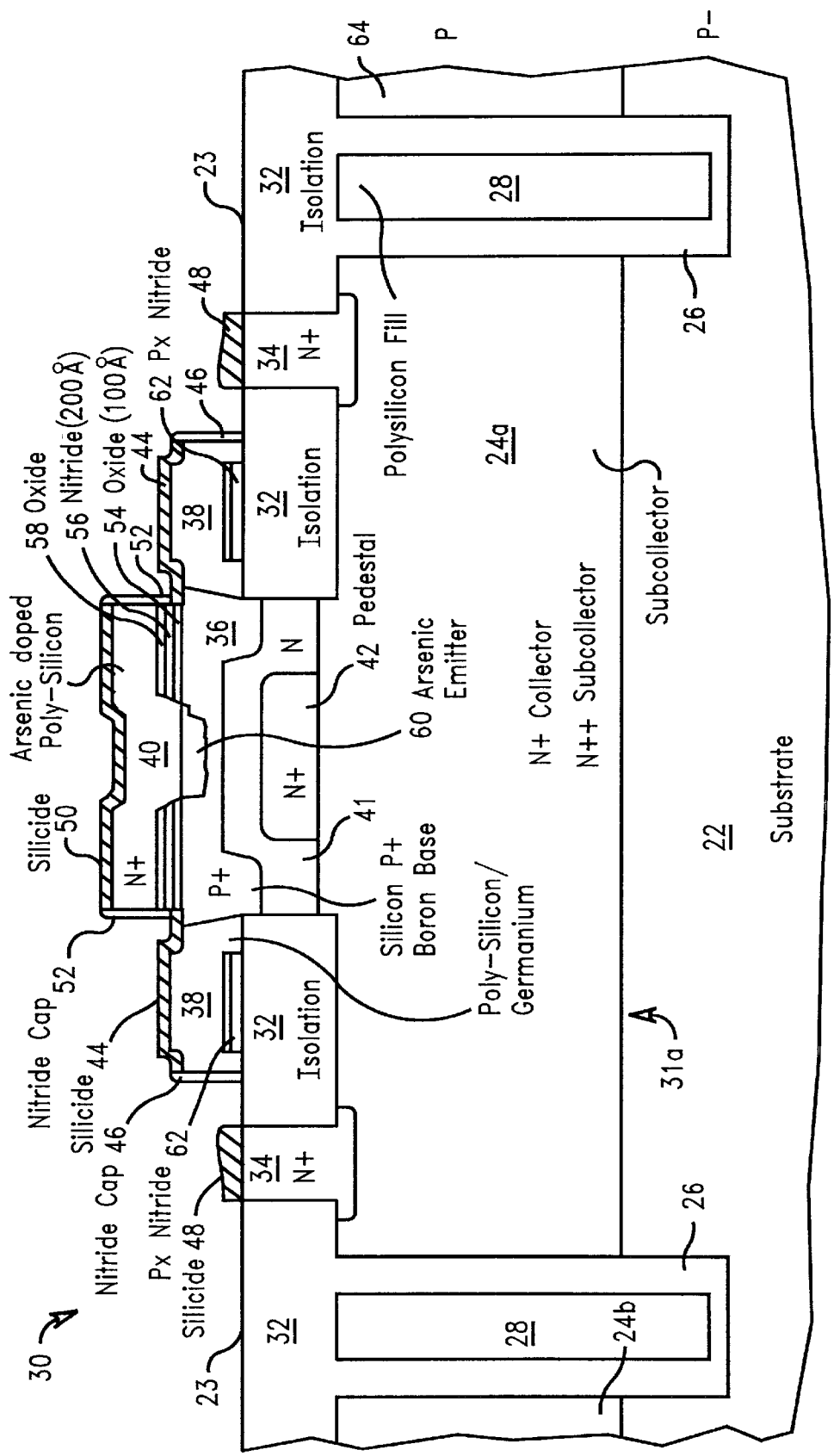
FIG. 10 is an elevation view of a cross-section of another embodiment of the SiGe diode network of the present invention.

A more detailed disclosure of the films used in the individual elements and regions for the diode network of the present invention are shown in FIG. 10. In this embodiment, as compared to the embodiment of FIG. 1, there are provided a pair of n+ collector reach through regions 34. Each reach though region 34 has on each side shallow trench isolation regions 32. Above each of the reach through regions 34 there is provided a silicide layer 48, also known as a salicide film made with titanium, titanium nitride, cobalt or the like. An n+ pedestal region 42 may be provided in the central area of region 41. A PX nitride layer is disposed above the STI regions 32 and below polycrystalline SiGe base contact regions 38. Above the base contact regions 38 there is a silicide layer 44, similar to layer 48. The arsenic doped polysilicon emitter 40 contacts the silicon germanium base layer 36 through an arsenic emitter region 60. On each side of the region of contact between the emitter 40 and the region of contact between the emitter 40 and single crystal SiGe base 36, there are sequential layers of oxide 54, nitride 56 and oxide 58. A nitride cap 52 is provided along the side edge of the emitter and oxide/nitride/oxide layers. Likewise a nitride cap 46 may be provided along the side surfaces of base contact regions 38 and silicide cap 44. A silicide cap 50 is also provided over the emitter region 40.

Figure 11:
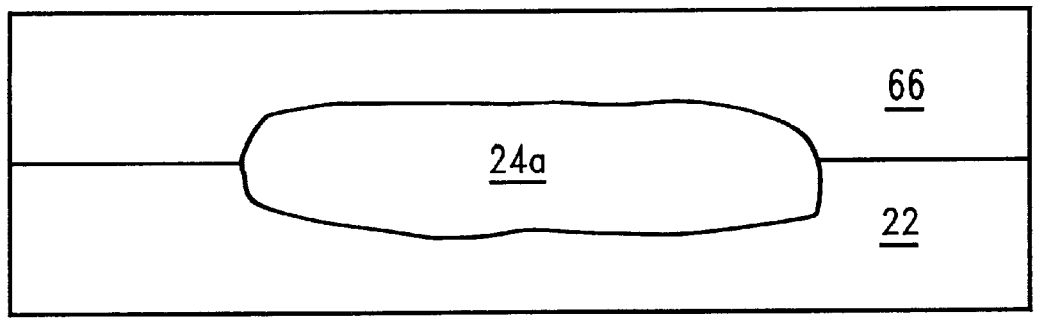
FIGS. 11–23 are sequential a cross-sectional elevational views depicting forming an embodiment of the SiGe diode network of the present invention.

To make the diode network of the present invention, there is first provided a wafer having a silicon substrate of a first dopant type, for example, a p− dopant. A subcollector (NZ) mask is placed on the substrate wafer and an NZ resist is formed across the wafer. The mask is then selectively removed to open a central region for the subcollector implant. A high dose implant is done of a second dopant type, for example, a n+ dopant, to form a subcollector region in the lower portion of the substrate. Subsequently, the NZ resist is stripped off the wafer, a reoxidation is performed, and, as shown in FIG. 11, an n− epitaxial layer 66is grown on and over the n+ subcollector 24 and all other regions of the wafer substrate 22, forming a uniform epitaxial region.

Figure 12:
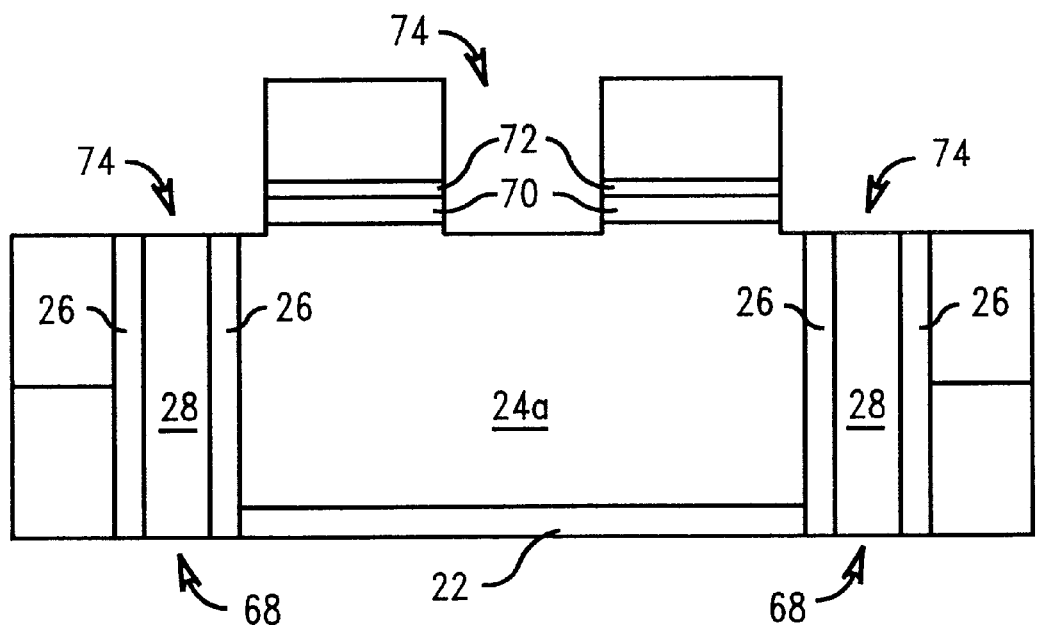
Figure 13:
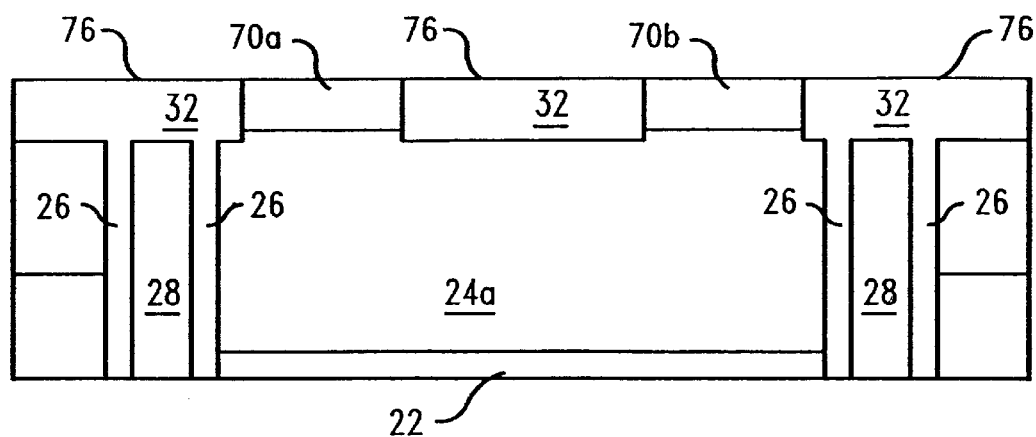

Subsequently, a deep trench (DT) resist is deposited and selectively removed to form a mask for etching of a pair of deep trenches in the substrate. Etching is done by reactive ion etching (RIE) or other suitable technique to form the trench regions 68 in the desired locations down to substrate 22 on either side of the n+ subcollector region 24a. A channel stop is then implanted across the wafer forming an implant at the bottom of the trench, and, as depicted in FIG. 12, an isolation film is deposited thereover to form an oxide dielectric 26. Subsequently the trench is filled with polysilicon 28, forming the deep trench isolation. To form the shallow trench isolation, there is first deposited an oxide film followed by a nitride film over the oxide film. A resist mask (RX) is placed on the regions for isolation definition and an RX etch is performed to create the shallow trench regions 74. Subsequently an oxide such as silicon oxide is deposited on the wafer to form the shallow trench isolation regions 32 which are separated by oxide regions 70a, 70b (FIG. 13). The wafer is then planarized to form a planar surface 76. A reach-through region is formed by depositing a reach through mask over the desired regions, a reach through implant resist (RN) is selectively deposited, leaving an opening at oxide region 70b between shallow trench isolation regions 32. The reach through implant is then performed at region 70b using ion implantation across the wafer, which followed by stripping of the RN resist.

An NPN protective oxide is then deposited over the surface 76 of the wafer, and a protect nitride resist (PX) is deposited and removed, except over oxide region 70a and a portion of the adjacent shallow trench isolation regions 32. The PX nitride is then stripped except under the PX resist, leaving NPN protective nitride over oxide region 70a and a portion of the adjacent shallow trench isolation regions 32. An n-well (NW) mask and resist is then formed uniformly on the wafer and an n-well implant is placed in a P-FET MOSFET, but not in the NPN region over oxide region 70a. The NW resist is then stripped. A DN mask is then applied followed by a DN resist and removal of the DN mask. PMOS channel implants are then implanted in the well area.

Figure 14:
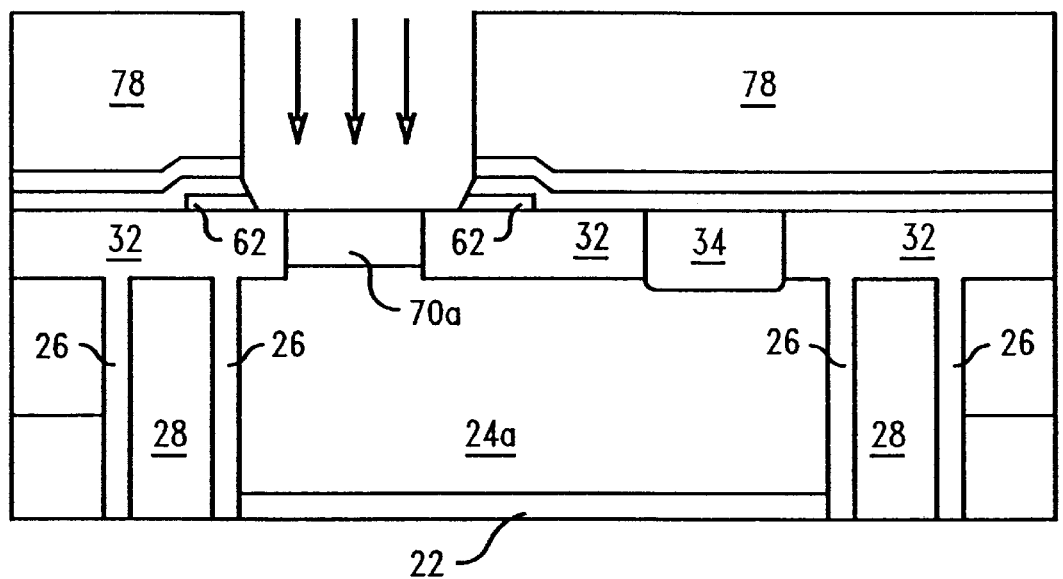

To form the p-well implants for the NFET, a mask (BF) is applied and resist formed. A p-well implant is then made in non-NPN or PMOS areas, on either side of deep trench isolation regions 26, 28, followed by removal of the BF mask. Next, as shown in FIG. 14, a FET protective oxide layer is applied followed by polysilicon protective layer and oxide layers. Subsequently a resist layer(BX) 78 is deposited and a mask is formed to reveal the area 70a which will form the pedestal. A deep pedestal n implant is then performed followed by etching of the PX nitride to form separate nitride areas 62 over the shallow trench isolations 32 adjacent pedestal area 70a.

Figure 15:
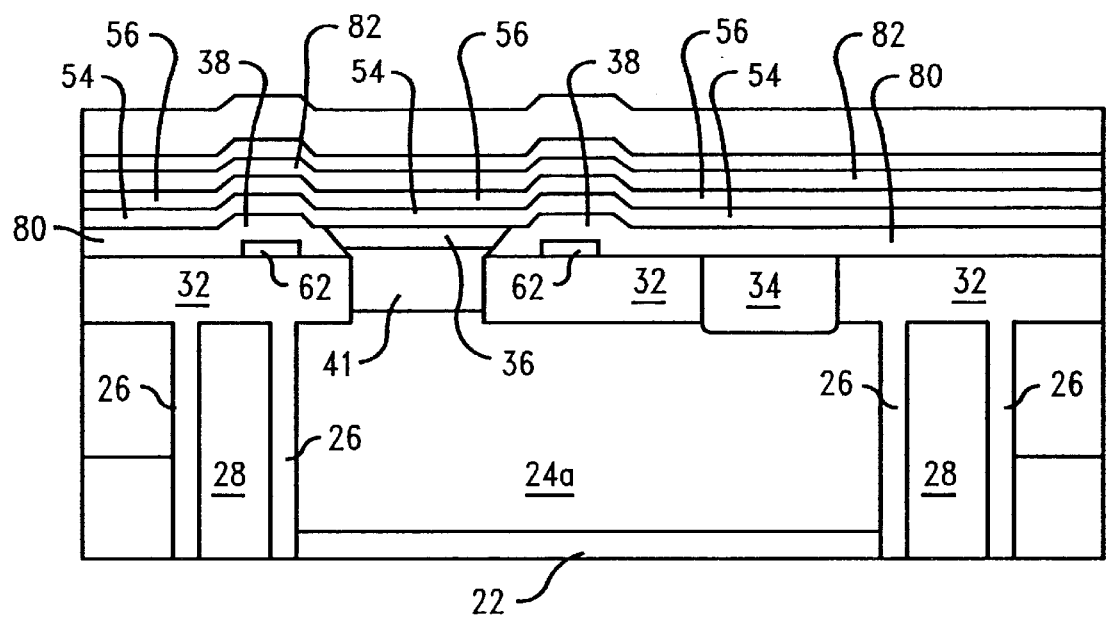
Figure 16:
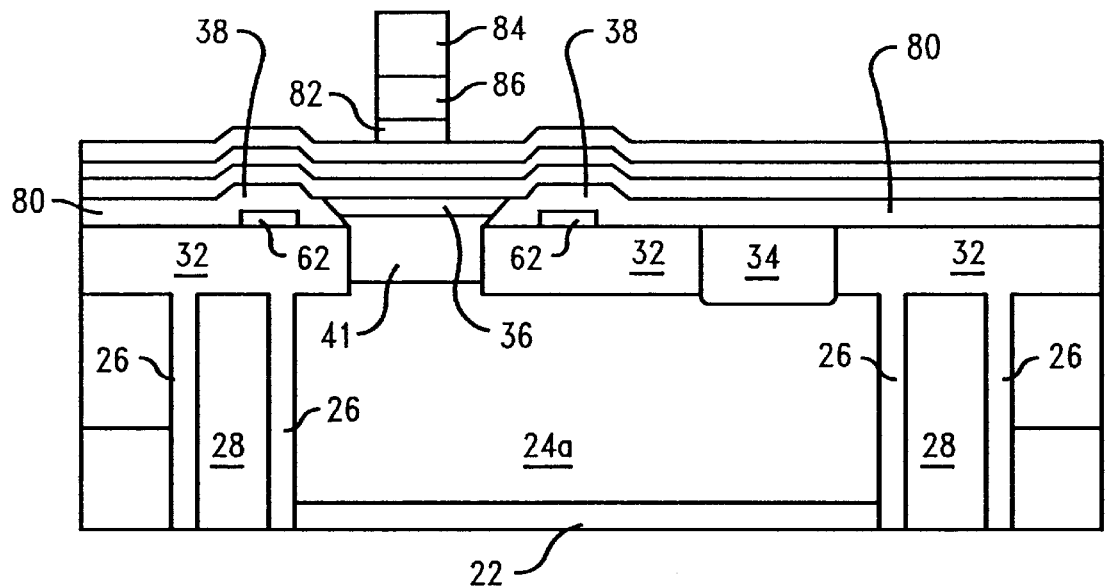
Figure 17:
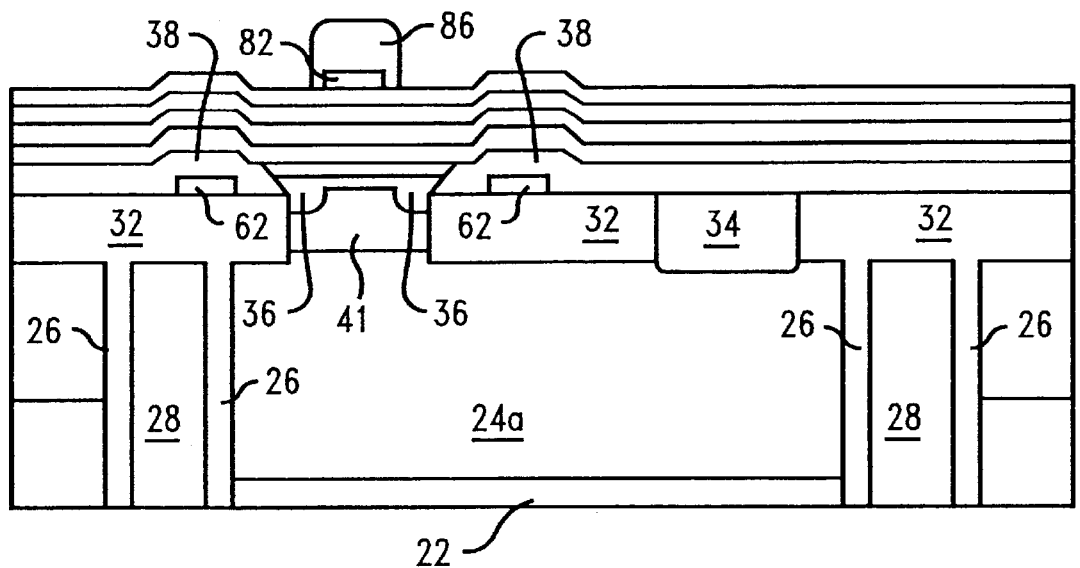

As shown in FIG. 15, there is performed low temperature epitaxial (LTE) film growth of Si/SiGe film. The SiGe film forms as a single crystal film layer in portion 36 directly over pedestal area 70a on collector 24a, and as a polycrystalline or amorphous film layer in adjacent portions 38 directly over STI regions 32. Thereafter oxide layer 54 is grown followed by a nitride layer 56 followed by growing or depositing of the emitter films. To define the emitter and extrinsic base, as shown in FIG. 16, an emitter (EN) mask and resist layer 84 are applied followed by stripping of the EN resist. The oxide 54 and nitride 56 layers are etched to define the emitter region followed by stripping of the EN resist and forming oxide 86 over and alongside emitter 82 (FIG. 17). To implant the extrinsic base. a spacer deposit is made and etched to define the spacing between the base and the emitter. The base is then implanted with p+ dopants. Next the oxide spacer is removed and there is performed a high pressure oxidation (hipox) polysilicon conversion to oxide followed by an oxide etch and removal of the emitter window.

Figure 18:
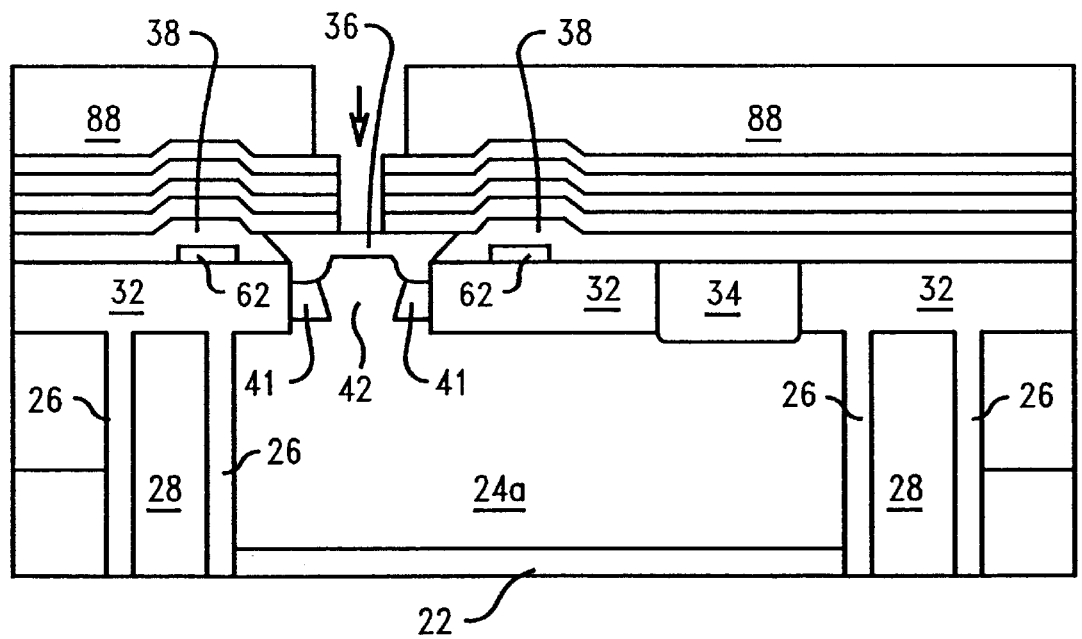
Figure 19:
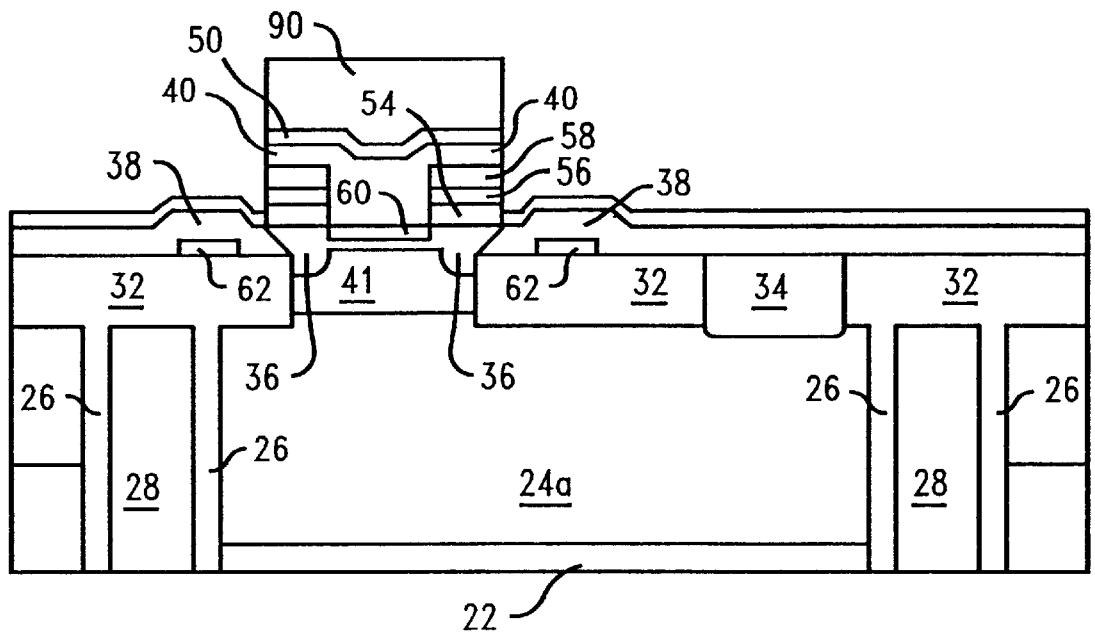
Figure 20:
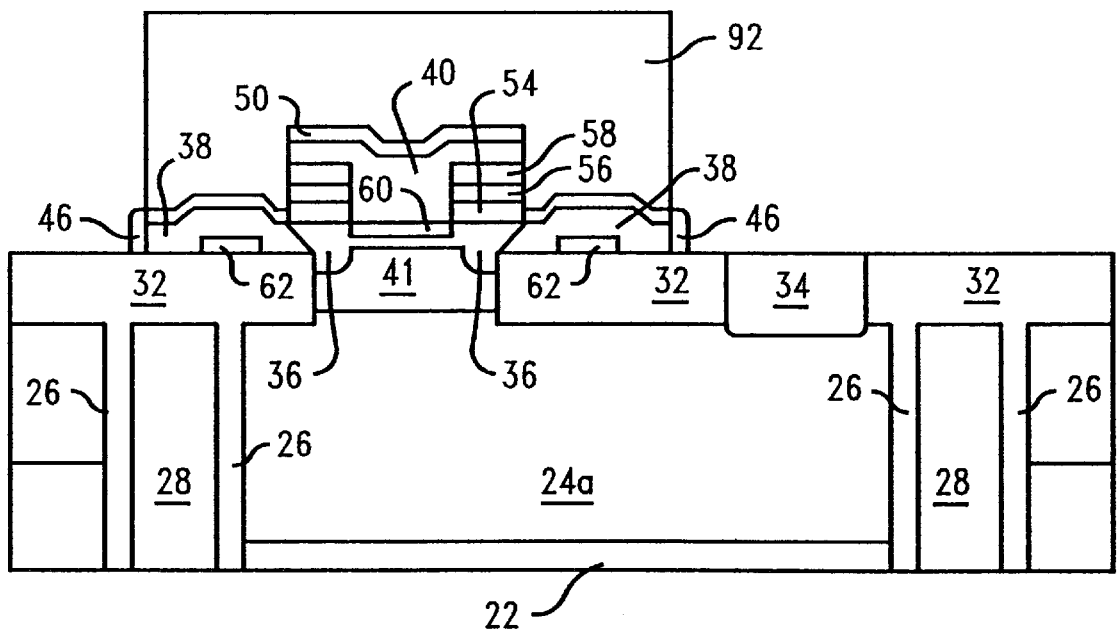
Figure 21:
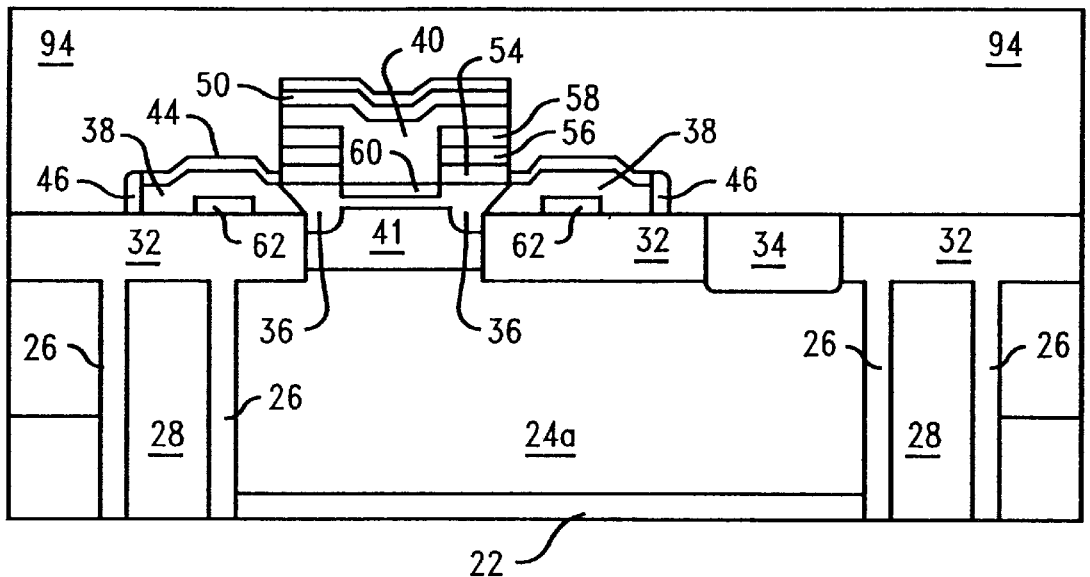

Optionally, as shown in FIG. 18, there is a pedestal implant. First a mask (N2) and resist layer 88 is defined to expose the emitter area and an n+ implant of pedestal 42 is made in the emitter area. Thereafter there is a polysilicon deposit in the emitter area followed by polysilicon implantation and a polysilicon cap on the polysilicon gate film (FIG. 19). As also shown in FIG. 19, a mask (NP) and resist 90 is deposited over and defines the emitter films, leaving the remaining surface exposed. FIG. 20 depicts an n+ polysilicon film 40 and n+ polysilicon nitrite cap 46 deposited adjacent the emitter 40 films. The emitter polysilicon is then etched leaving n+ polysilicon film and n+ polysilicon nitrite cap. The resist is then stripped, and a mask (PB) and resist 92 is applied over the n+ polysilicon film and n+ polysilicon nitrite cap and emitter films, followed by etching of the polysilicon films around the PB resist area. Subsequently, a BN mask and resist is applied over the entire surface (FIG. 21) and the p– channel MOSFET source/drain implant is performed, followed by removal of the BN resist (FIG. 22).

Figure 22:
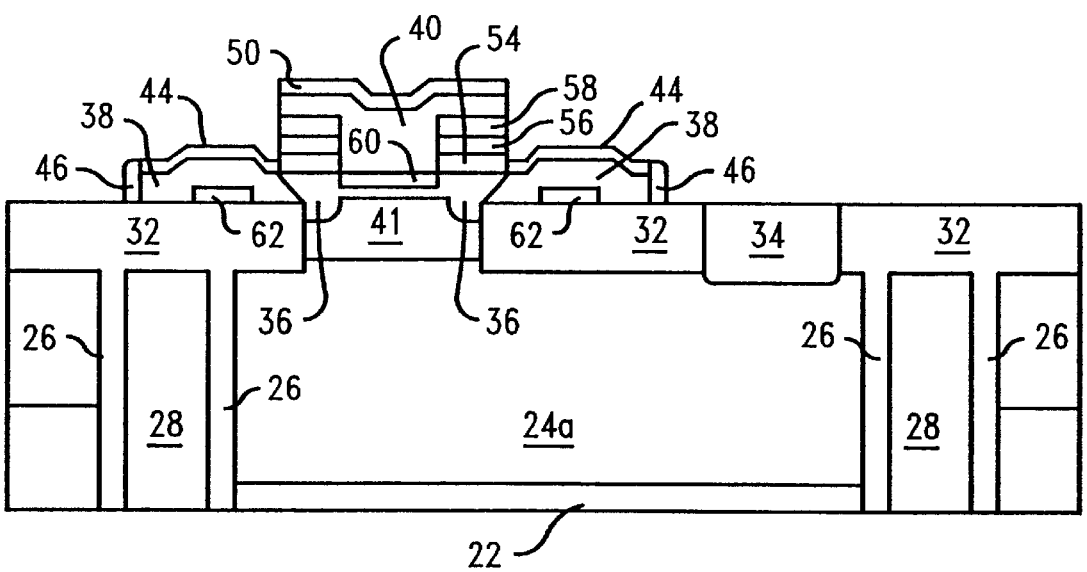
Figure 23:
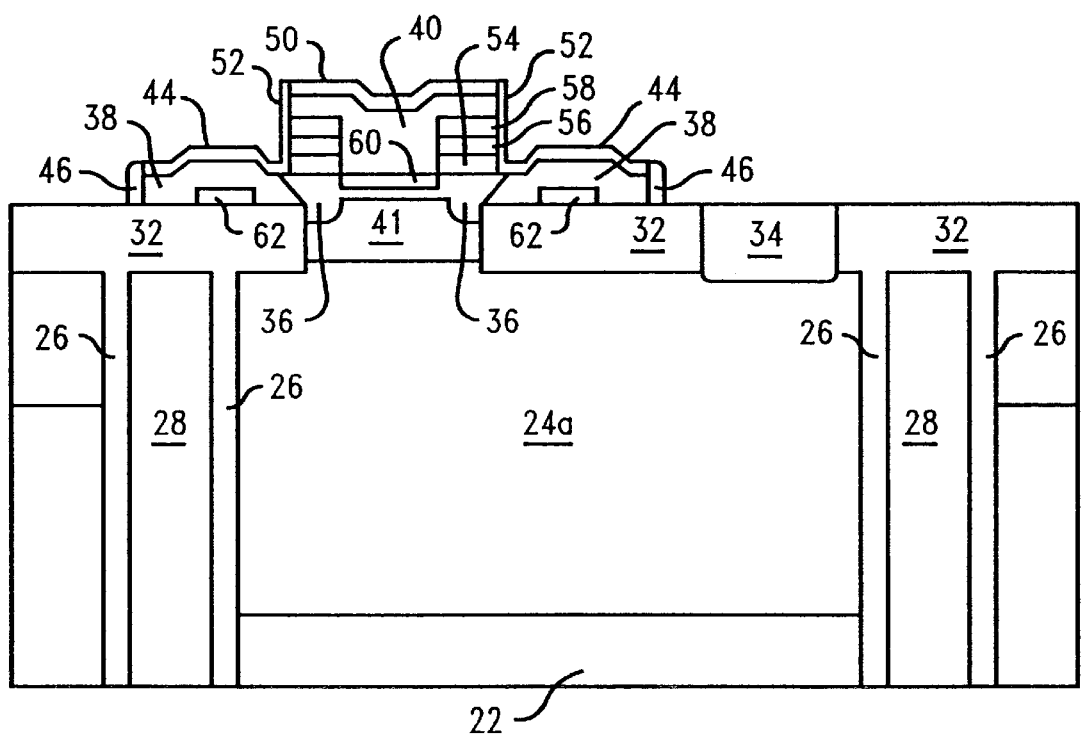
Figure 24:
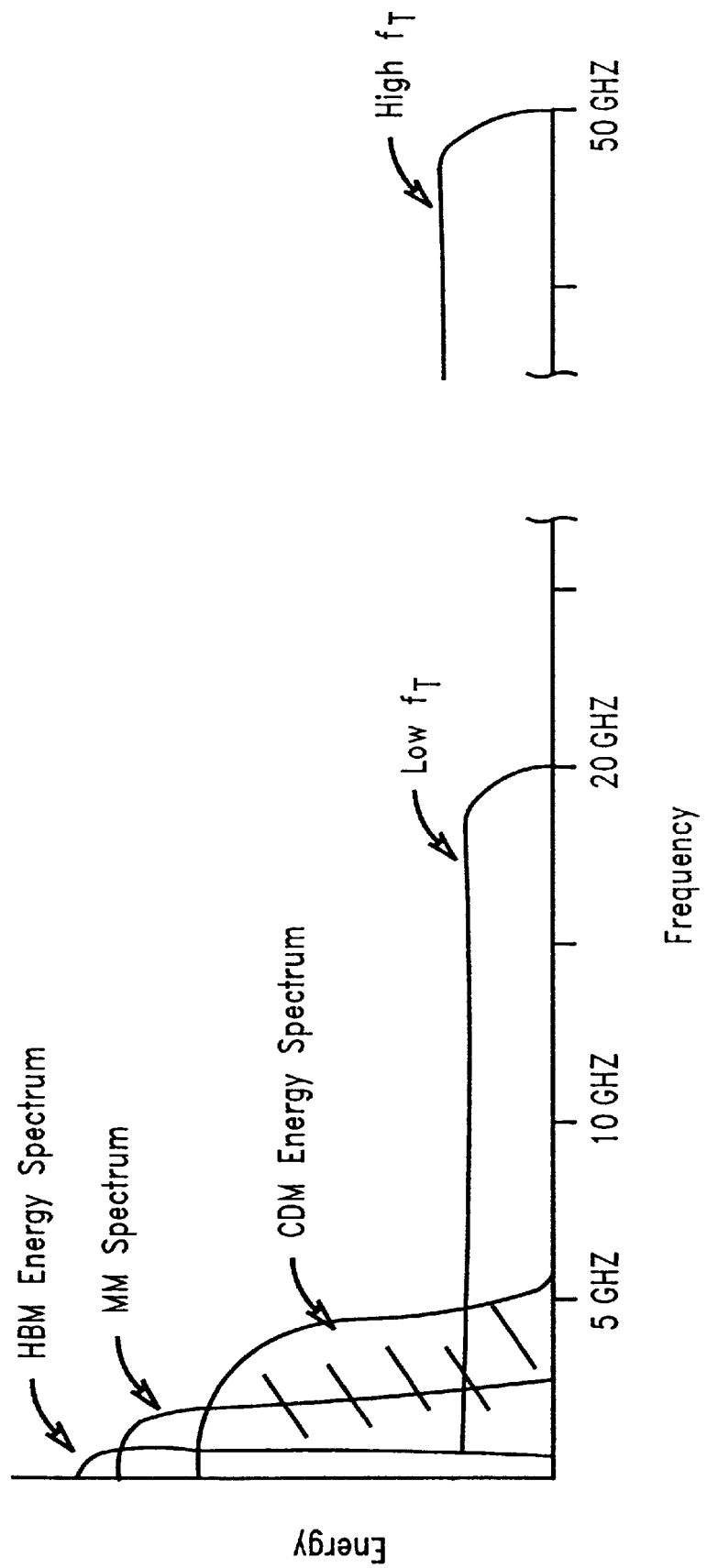

As shown in FIG. 22, there is deposited titanium silicide with the silicide forming the p+poly regions. Subsequently, in FIG. 23, the silicide cap TiSix 44 formation is performed. This then arrives at the preferred embodiment of the silicon germanium ESD structure of the present invention. Subsequently standard back end of line (BEOL) levels are deposited to make the desired circuit connections.

To provide an ESD protection system which functions without impacting the functional performance of the active and passive elements' chip performance, the present invention also provides an ESD element which is faster than the ESD HBMK MM, and CDM phenomenon, above a frequency of 5 GHz, and which has a cutoff frequency less than the high speed functional transistor, such as a CMOS or $B_1$ CMOS standard device. The frequency versus energy characteristics of the HBM, MM and CDM models use to describe ESD phenomenon are shown graphically in FIG. 24. The low frequency transistor and high frequency transistors are also shown, with ESD cutoff frequencies $f_T$ of about 20 GHz and 50 GHz, respectively. The present invention provides an ESD element of:

$$f(ESD) < f < f^*$$

where f* is the functional high speed/low breakdown transistor frequency, f(ESD) is the cutoff frequency of ESD phenomenon , and f is the cutoff frequency of the ESD device of the present invention. Generally, this means that the ESD protection system of the present invention has a frequency cutoff of about 5 GHZ to about 20 GHz or higher, depending on the transistor to be protected Without impacting the non-ESD device performance, the ESD protection system turns on first to discharge power to ground. Since the transistor is in its cutoff regime, the device would be inactive during functional response.

By way of example, the side-by-side SiGe devices of FIG. 1 may be configured to have one of the devices provide a frequency ESD protection for the other device. For example, the first device, 31a, is a functional transistor with a frequency response f* and the second device on the chip, 31b, is an ESD device with frequency response less than f*, but greater than the cutoff frequency of the desired ESD phenomenon. The first and second devices may be SiGe or non-SiGe devices.

The second, ESD device whose cutoff frequency satisfies this can be made by modifying the process or the structural design of the SiGe device of the present invention. Reference is made to FIG. 10 as an example of the process or structural design modifications in order to achieve the desired ESD cutoff frequency. To achieve this using process changes, the pedestal implant 42 can be removed from the transistor. By removing the pedestal implant, typically the cutoff frequency of the transistor will decrease on the order of a factor of 2, e.g., 27 GHZ vs. 50 GHz. The frequency of the device may also be degraded by removing the subcollector implant 24a, or by removing the reachthrough element 34, or other collector resistance. Other means to reduce the frequency response is by a different germanium profile or removal of the germanium, providing a homojunction transistor for ESD and a SiGe transistor for applications. In SiGeC technology (where the epitaxial base of the device is composed of SiGeC), removal of the carbon from the ESD element provides a lower frequency ESD device relative to the high frequency element. Collector doping concentration may be lowered to provide a higher collector resistance with lower cutoff frequency. To achieve ESD device cutoff frequency satisfies by design changes, for example, the emitter 60 can be widened using the NP shape and the contacts can be moved to the edges to increase the ESD device emitter resistance. Increases in the base resistance using external elements may also achieve a lower frequency device.

Structurally, removing the deep trenches 28 from the SiGe device lowers the cutoff frequency but improves the ESD robustness of the structure due to lower thermal resistance. Hence a technology with a deep trench structure can provide a high speed functional bipolar, but the ESD element can be a nontrench SiGe transistor with higher ESD robustness but lower cutoff frequency. A collector may be designed as a one-sided collector to impact the frequency response of the device. For example, a two sided collector can have a $f_T$ which is 2x a one-sided device.

The table below shows the effects of the various process, design and structural changes on a frequency cutoff ESD device, as compared to an SiGe or non-SiGe functional device. One or more of these changes may be made in order to construct the frequency cutoff device of the present invention.

TABLE

| ESD Device | Functional Transistor | Effect |
| --- | --- | --- |
| no pedestal implant | pedestal implant | presence or absence modifies base-collector capacitance (Cbc) and pinch resistance which adjusts the device's frequency response |
| no reachthrough implant | reachthrough implant | |
| no subcollector | subcollector | |
| no germanium | germanium | |
| no deep trench | deep trench | without DT means greater heat dissipation capabilities |
| no carbon in base | carbon in base | |
| no graded SiGe base or different graded base | graded SiGe base | |
| wide base width | narrow (standard) base width | |
| increased CA to emitter spacing | standard CA to emitter spacing | improved resistance and thermal purposes |
| increased CA to base spacing | standard CA to base spacing | |

Figure 25:
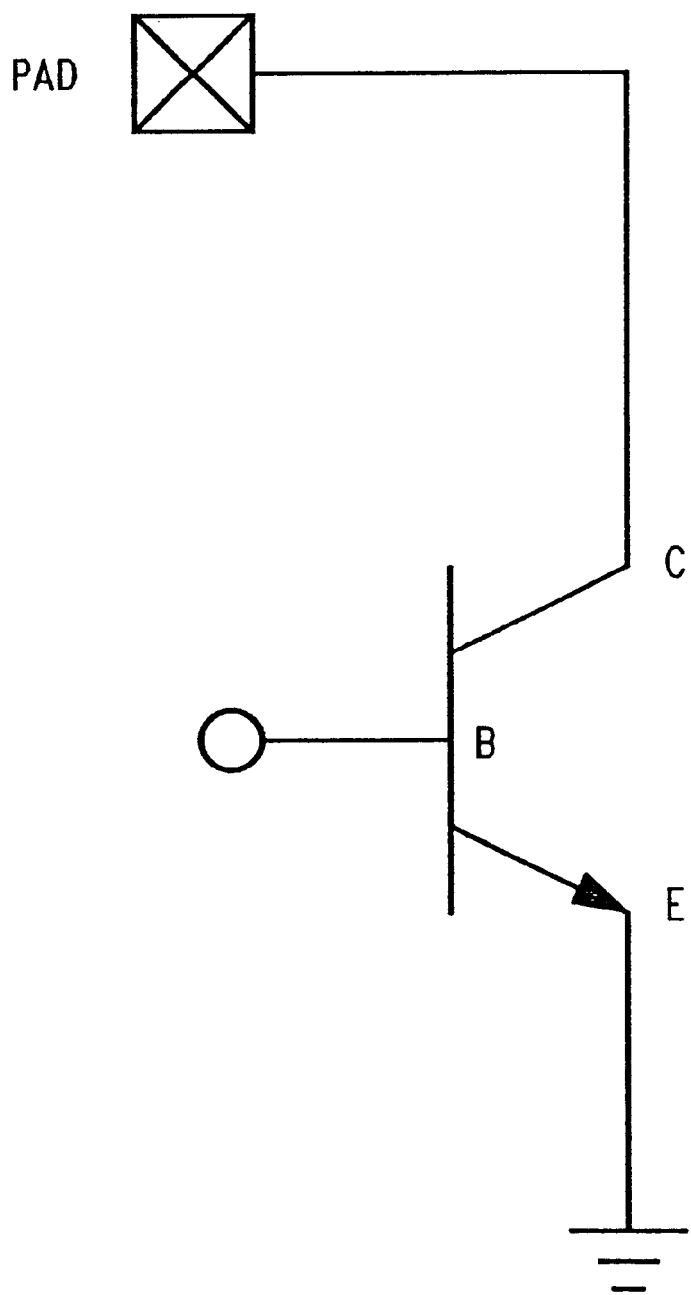
FIGS. 25–28 are circuit diagrams showing different embodiments of a frequency cutoff ESD protection network.
Figure 26:
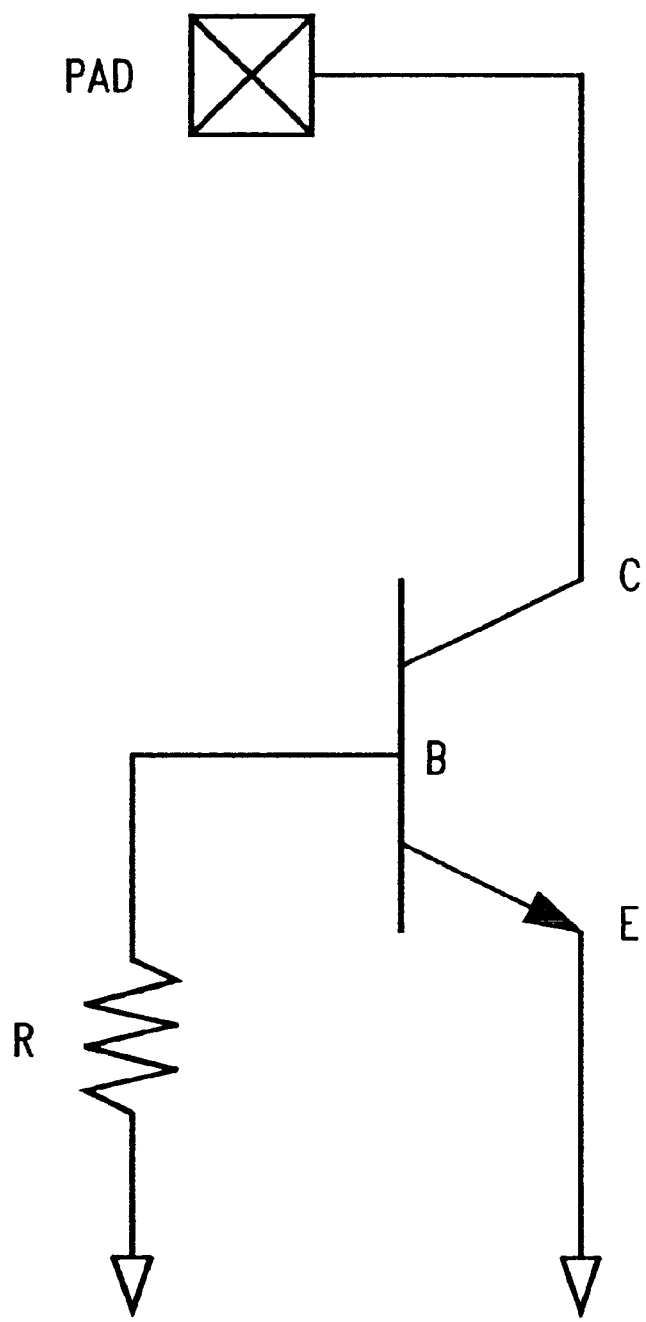
Figure 27:
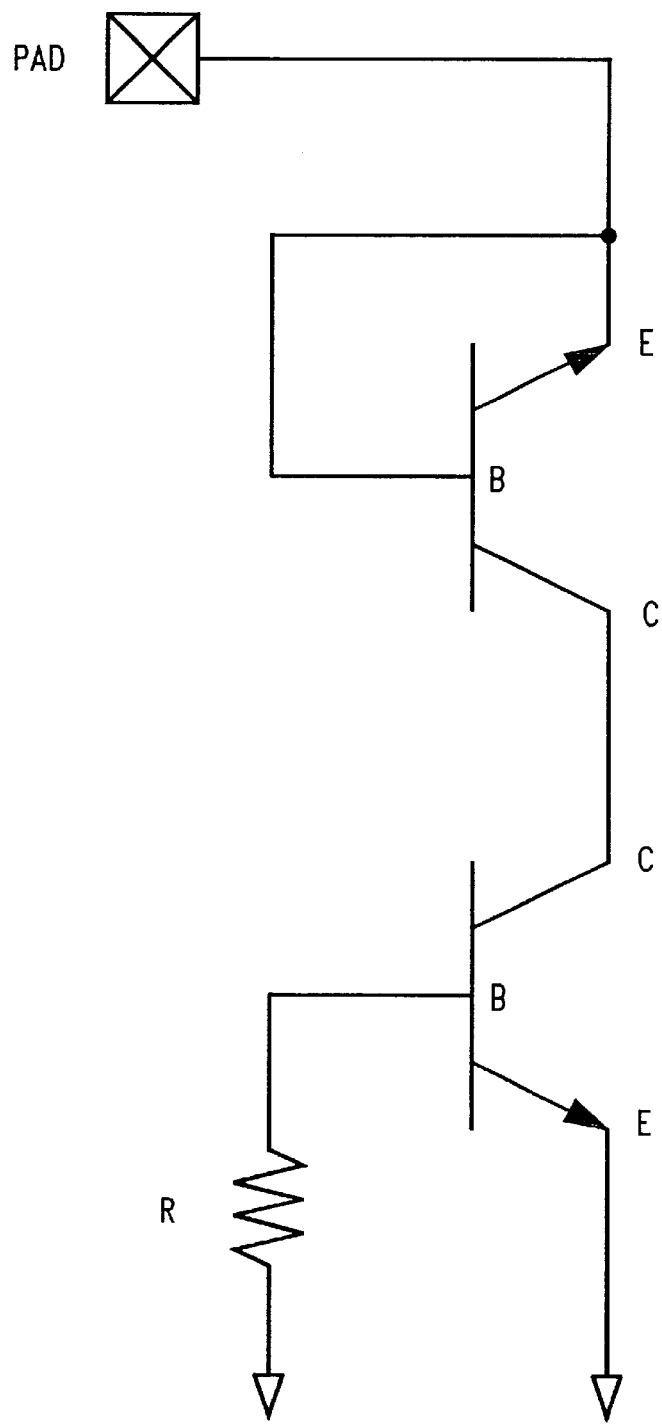
Figure 28:
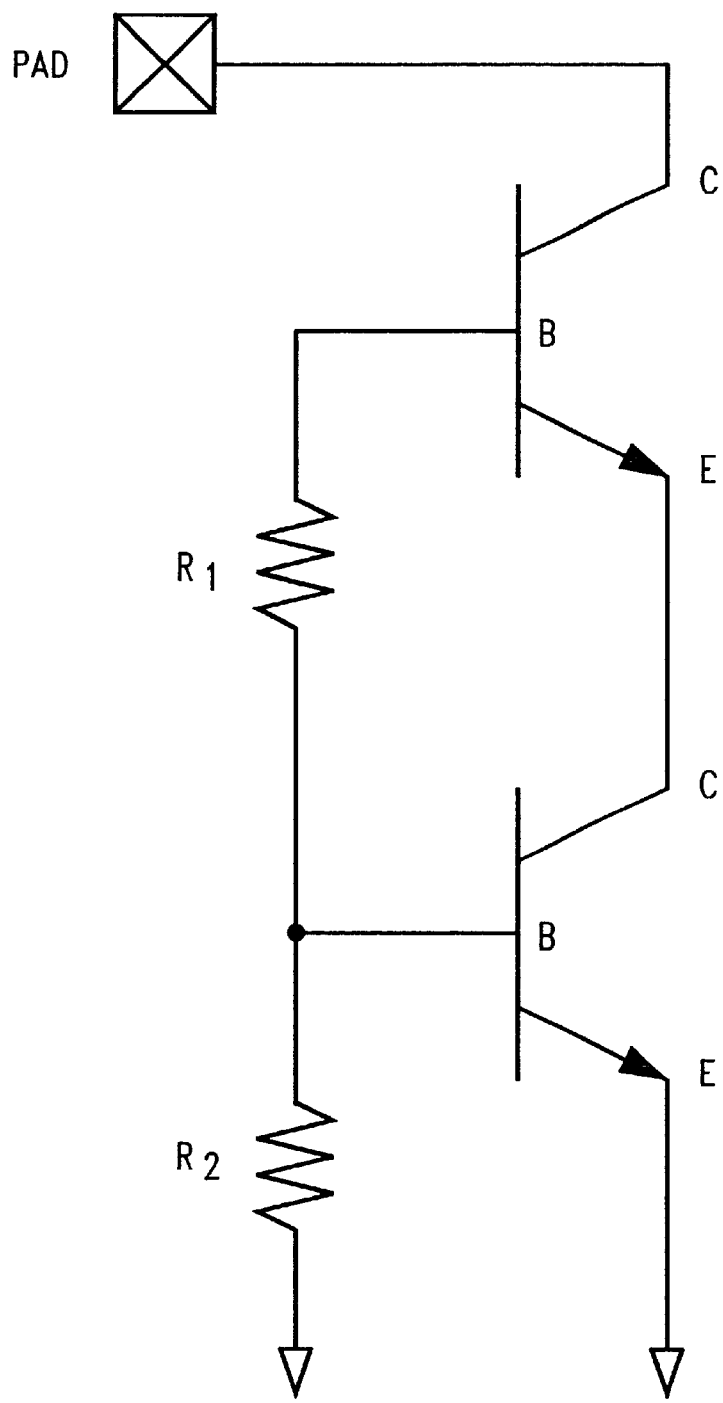

As shown in FIGS. 25–28, the ESD device of the present invention can be used configured in a variety of ways. FIG. 25 shows the npn ESD device in a common-emitter mode of operation where the collector is connected to the pad and the emitter is connected to a node between the pad and the ground potential (or $V_{ss}$ or $V_{EE}$). FIG. 26 shows an ESD device similar to the device in FIG. 25, except that the base is grounded through a resistor. FIG. 27 shows two series npn ESD devices in a cascode arrangement, where the upper device is in a diode configuration with common collector and the lower device is in common emitter mode with the base connected to ground through a resistor. FIG. 28 shows two common emitter devices in a series, configuration cascoded with the bases connected through resistors to ground.

Thus, the present invention provides a system for an improved ESD protection system for microelectronic devices which does not degrade the performance of such devices and which prevents harmful voltage and current spikes for microelectronic devices. The present invention provides ESD protection for digital, analog and radio frequency (RF) applications, and for mixed voltage and mixed signal applications. More particularly, the disclosed SiGe HBT devices in diode configuration provide ESD protection, the SiGe HBT device base-collector or base-emitter junctions provide ESD protection for positive pulses, and the SiGe HBT device collector-substrate junctions provide ESD protection for negative pulses. The SiGe HBT devices in serial configuration also provide ESD protection for mixed signal applications.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A silicon-germanium ESD element comprising:
    a substrate of a first dopant type coupled to a first voltage terminal;
    a first diode-configured element having:
        a collector region of a second dopant type in the substrate;
        a SiGe base layer of the first dopant type on the collector region, the SiGe base layer including a base contact region; and
        an emitter of the second dopant type on the SiGe base layer.

2. The ESD element of claim 1 wherein the SiGe base layer ion the collector region is an epitaxial SiGe layer.

3. The ESD element of claim 1 wherein the second dopant type of the emitter is diffused in to the SiGe base layer.

4. The ESD element of claim 1 further including isolation regions adjacent the collector region and below a portion of the SiGe base layer, and wherein the SiGe base layer comprises an active, single crystal layer in a portion directly over the collector region and a polycrystalline layer in portions directly over the isolation regions.

5. The ESD element of claim 1 further including a second diode-configured element having:
    a collector region of the second dopant type in the substrate;
    a SiGe base layer of the first dopant type on the collector region, the SiGe base layer including a base contact region; and
    an emitter of the second dopant type on the SiGe base layer; and
    an isolation region in the substrate separating the first and second diode-configured elements, the first and second diode-configured elements forming a diode network.

6. The ESD element of claim 5 wherein the isolation region is a shallow trench isolation.

7. The ESD element of claim 5 wherein the isolation region is a deep trench isolation.

8. The ESD element of claim 5 wherein isolation regions are disposed adjacent the collector regions of each of the diode elements and below a portion of the SiGe base layer of each of the diode elements, and wherein the SiGe base layer of each of the diode elements comprises an active, single crystal layer in a portion directly over the collector region of each of the diode elements and a polycrystalline layer in portions directly over the isolation regions of each of the diode elements.

9. A diode network comprising:
    a substrate of a first dopant type coupled to a first voltage terminal;
    a first diode element and a second diode element, each diode element having:
        a collector region of a second dopant type in the substrate;
        a SiGe base layer of the first dopant type on the collector region, the SiGe base layer including a base contact region;
        an emitter of the second dopant type on the SiGe base layer; and
        a circuit electrically coupling the emitter to the base contact region;
    an input pad coupled to the coupled emitters/contact regions of the first and second diode elements;
    the collector region of the first diode element coupled to a second voltage terminal, wherein the SiGe base layer of the first diode element comprises an anode of the first diode element and the collector region of the first diode element comprises a cathode of the first diode element; and
    the collector region of the second diode element coupled to the input pad, wherein the substrate comprises an anode of the second diode element and the collector region of the second diode element comprises a cathode of the second diode element.

10. The diode network of claim 9 wherein isolation regions are disposed adjacent the collector regions of each of the diode elements and below a portion of the SiGe base layer of each of the diode elements, and wherein the SiGe base layer of each of the diode elements comprises an active, single crystal layer in a portion directly over the collector region of each of the diode elements and a polycrystalline layer in portions directly over the isolation regions of each of the diode elements.

11. A diode network comprising:
    a substrate of a first dopant type coupled to a first voltage terminal;
    a first diode element and a second diode element, each diode element having:
        a collector region of a second dopant type in the substrate;.
        a SiGe base layer of the first dopant type on the collector region, the SiGe base layer including a base contact region; and
        an emitter of the second dopant type on the SiGe base layer;
    a circuit electrically coupling the emitter to the base contact region in the first diode element;
    a circuit electrically coupling the emitter in the second diode element to the substrate and first voltage terminal;
    an input pad coupled to the coupled emitters/contact region of the first diode element and the collector region of the second diode element;
    the collector region of the first diode element coupled to a second voltage terminal, wherein the SiGe base layer of the first diode element comprises an anode of the first diode element and the collector region of the first diode element comprises a cathode of the first diode element; and
    the collector region of the second diode element coupled to the input pad, wherein the SiGe base layer comprises an anode of the second diode element and the collector region of the second diode element comprises a cathode of the second diode element.

12. The diode network of claim 11 wherein isolation regions are disposed adjacent the collector regions of each of the diode elements and below a portion of the SiGe base layer of each of the diode elements, and wherein the SiGe base layer of each of the diode elements comprises an active, single crystal layer in a portion directly over the collector region of each of the diode elements and a polycrystalline layer in portions directly over the isolation regions of each of the diode elements.

13. A diode network comprising:
    a substrate of a first dopant type coupled to a first voltage terminal;
    a first diode element and a second diode element, each diode element having:
        a collector region of a second dopant type in the substrate;
        a SiGe base layer of the first dopant type on the collector region, the SiGe base layer including a base contact region; and
        an emitter of the second dopant type on. the SiGe base layer;
    a circuit electrically coupling the emitter to the base contact region;
    an input pad coupled to the coupled emitters/contact region of the second diode element;
    the collector region of the first diode element coupled to a second voltage terminal, wherein the SiGe base layer of the first diode element comprises an anode of the first diode element and the collector region of the first diode element comprises a cathode of the first diode element; and
    the collector region of the second diode element coupled to the coupled emitters/contact region of the first diode element, wherein the SiGe base layer of the second diode element comprises an anode of the second diode element and the collector region of the second diode element comprises a cathode of the second diode element.

14. The diode network of claim 13 wherein isolation regions are disposed adjacent the collector regions of each of the diode elements and below a portion of the SiGe base layer of each of the diode elements, and wherein the SiGe base layer of each of the diode elements comprises an active, single crystal layer in a portion directly over the collector region of each of the diode elements and a polycrystalline layer in portions directly over the isolation regions of each of the diode elements.

15. A diode comprising:
    a substrate of a first dopant type coupled to a first voltage terminal;
    a diode element having:
        a collector region of a second dopant type in the substrate;
        a SiGe base layer of the first dopant type on the collector region, the SiGe base layer including a base contact region; and
        an emitter of the second dopant type on the SiGe base layer;
    the collector region of the diode element coupled to an input pad and the emitter of the diode element coupled to a second voltage terminal, wherein the substrate comprises an anode of the diode element and the collector region comprises a cathode of the diode element.

16. The diode of claim 15 wherein isolation regions are disposed adjacent the collector region and below a portion of the SiGe base layer, and wherein the SiGe base layer comprises an active, single crystal layer in a portion directly over the collector region and a polycrystalline layer in portions directly over the isolation regions.

17. A diode comprising:
    a substrate of a first dopant type coupled to a first voltage terminal;
    a diode element having:
        a collector region of a second dopant type in the substrate;
        a SiGe base layer of the first dopant type on the collector region, the SiGe base layer including a base contact region;
        an emitter of the second dopant type on the SiGe base layer; and
    an input pad coupled to the SiGe base layer;
    the collector region of the diode element coupled to both the input pad and the base layer, and the emitter of the diode element coupled to a second voltage terminal, wherein the substrate comprises an anode of the diode element and the collector region comprises a cathode of the diode element.

18. The diode of claim 17 wherein isolation regions are disposed adjacent the collector region and below a portion of the SiGe base layer, and wherein the SiGe base layer comprises an active, single crystal layer in a portion directly over the collector region and a polycrystalline layer in portions directly over the isolation regions.

19. A diode network comprising:
a substrate of a first dopant type coupled to a first voltage terminal;
a plurality of diode elements, each diode element having:
a collector region of a second dopant type in the substrate, each collector region being coupled to the first voltage terminal;
a SiGe base layer of the first dopant type on the collector region, the SiGe base layer including a base contact region; an emitter of the second dopant type on the SiGe base layer;
an input pad coupled to the emitter of a first one of the diode elements; and a plurality of clamping elements coupled in series, the base layer of each diode element being coupled to the emitter of an adjacent diode element, except for the base layer of a last one of the diode elements being coupled to a second rail voltage source, each of the clamping elements being connected across the coupled base-emitters of adjacent diode elements.

20. The diode network of claim 19 wherein isolation regions are disposed adjacent the collector regions of each of the diode elements and below a portion of the SiGe base layer of each of the diode elements, and wherein the SiGe base layer of each of the diode elements comprises an active, single crystal layer in a portion directly over the collector region of each of the diode elements and a polycrystalline layer in portions directly over the isolation regions of each of the diode elements.

21. The diode network of claim 19 wherein the clamping elements are selected from the group consisting of reach through resistors, silicon germanium polysilicon resistors, silicon germanium npns, and silicon germanium pnps.

22. A diode network comprising:
a substrate of a first dopant type coupled to a first voltage terminal;
a plurality of diode elements, each diode element having:
a collector .region of a second dopant type in the substrate, each collector region being coupled to the first voltage terminal;
a SiGe base layer of the first dopant type on the collector region, the SiGe base layer including a base contact region;
an emitter of the second dopant type on the SiGe base layer; and
an input pad coupled to the emitter of a first one of the plurality of diode elements, the base layer of each of the plurality of diode elements being coupled to the emitter of an adjacent one of the plurality of diode elements, except for the base layer of a last one of the plurality of diode elements being coupled to the second voltage terminal, and including a further diode element having the base layer coupled to the base layer of the last of the plurality of diode elements, a collector region coupled to the first voltage terminal, and the emitter coupled to the second voltage terminal.

23. The diode network of claim 22 wherein isolation regions are disposed adjacent the collector regions of each of the diode elements and below a portion of the SiGe base layer of each of the diode elements, and wherein the SiGe base layer of each of the diode elements comprises an active, single crystal layer in a portion directly over the collector region of each of the diode elements and a polycrystalline layer in portions directly over the isolation regions of each of the diode elements.

24. A diode network comprising:
a substrate of a first dopant type coupled to a first voltage terminal;
a plurality of diode elements, each diode element having:
a collector region of a second dopant type in the substrate;
a SiGe base layer of the first dopant type on the collector region, the SiGe base layer including a base contact region;
an emitter of the second dopant type on the SiGe base layer; an input pad coupled to the base layer of a first one of the diode elements, the emitter of each of the diode elements being coupled to the base layer of an adjacent diode element, except for the emitter of a last one of the diode elements being coupled to a second rail voltage source.

25. The diode network of claim 24 wherein isolation regions are disposed adjacent the collector regions of each of the diode elements and below a portion of the SiGe base layer of each of the diode elements, and wherein the SiGe base layer of each of the diode elements comprises an active, single crystal layer in a portion directly over the collector region of each of the diode elements and a polycrystalline layer in portions directly over the isolation regions of each of the diode elements.

26. The diode network of claim 24 wherein each collector region is coupled to a common collector voltage terminal.

27. A frequency cutoff ESD protection network for high frequency applications comprising:
a first device on a chip having circuitry with a first frequency response; and
a second device on the chip having circuitry with a second frequency response, the second frequency response being less than the first frequency response.

28. The ESD protection network of claim 27 wherein at least one of the devices is a SiGe device.

29. The ESD protection network of claim 27 wherein the first and second devices are SiGe devices.

30. The ESD protection network of claim 27 wherein each of the first and second devices comprise:
a substrate of a first dopant type coupled to a first voltage terminal; and
a diode-configured element having:
a collector region of a second dopant type in the substrate;
a SiGe base layer of the first dopant type on the collector region, the SiGe base layer including a base contact region; and
an emitter of the second dopant type on the SiGe base layer.

31. The ESD protection network of claim 27 wherein the second device has circuitry having a second frequency greater than 5 GHz.

* * * * *